(12) United States Patent  
Ahn et al.

(10) Patent No.: US 9,293,494 B2
(45) Date of Patent: Mar. 22, 2016

(54) IMAGE SENSORS

(71) Applicant: Samsung Electronics Co., Ltd., Suwon-si, Gyeonggi-do (KR)

(72) Inventors: Jungchak Ahn, Yongin-si (KR); Youngsun Oh, Yongin-si (KR); Kyungho Lee, Suwon-si (KR); Dongyoung Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/675,915

(22) Filed: Apr. 1, 2015

(65) Prior Publication Data

US 2016/0027821 A1 Jan. 28, 2016

(30) Foreign Application Priority Data

Jul. 28, 2014 (KR) ........................ 10-2014-0095938

(51) Int. Cl.
*H01L 27/146* (2006.01)
(52) U.S. Cl.
CPC ...... *H01L 27/1463* (2013.01); *H01L 27/14636* (2013.01)
(58) Field of Classification Search
CPC .................................................. H01L 27/1463
USPC ....................................................... 257/446
See application file for complete search history.

(56) References Cited

U.S. PATENT DOCUMENTS

| | | | |
|---|---|---|---|
| 6,861,686 B2 | 3/2005 | Lee et al. | |
| 7,622,810 B2 | 11/2009 | Takao | |
| 7,709,795 B2 | 5/2010 | Yamanaka et al. | |
| 7,745,862 B2 | 6/2010 | Sohn | |
| 7,883,923 B2 | 2/2011 | Yoon | |
| 8,304,278 B2 | 11/2012 | Naruse et al. | |
| 8,420,438 B2 | 4/2013 | Hynecek et al. | |
| 2004/0132262 A1 | 7/2004 | Ayabe et al. | |
| 2004/0137701 A1 | 7/2004 | Takao | |
| 2004/0140564 A1 | 7/2004 | Lee et al. | |
| 2009/0039455 A1 | 2/2009 | Chien et al. | |
| 2009/0072283 A1 | 3/2009 | Sohn | |
| 2009/0114819 A1 | 5/2009 | Yamanaka et al. | |
| 2009/0166775 A1 | 7/2009 | Yoon | |
| 2010/0224918 A1 | 9/2010 | Lee | |
| 2011/0027934 A1 | 2/2011 | Naruse et al. | |
| 2011/0223707 A1 | 9/2011 | Hynecek et al. | |
| 2013/0323875 A1 | 12/2013 | Park et al. | |

FOREIGN PATENT DOCUMENTS

| | | |
|---|---|---|
| KR | 10-2010-0052944 B1 | 8/2002 |
| KR | 10-0680974 B1 | 2/2007 |
| KR | 10-2013-0134162 A | 12/2013 |

*Primary Examiner* — Anthony Ho
(74) *Attorney, Agent, or Firm* — Harness, Dickey & Pierce, P.L.C.

(57) ABSTRACT

An image sensor includes a substrate including a pixel region and a peripheral circuit region, and a first device isolation layer disposed in the substrate to define a plurality of unit pixels that are adjacent to each other in a first direction in the pixel region. Each of the plurality of unit pixels includes at least one light sensing element disposed in the substrate. The image sensor includes an interlayer insulating structure on the substrate, and a first blocking structure disposed on the first device isolation layer and penetrating the interlayer insulating structure. The first blocking structure is disposed between the plurality of unit pixels when viewed from a plan view. The first blocking structure extends in a second direction intersecting the first direction when viewed from a plan view.

20 Claims, 22 Drawing Sheets

2000

3000

IMAGE SENSORS

CROSS-REFERENCE TO RELATED APPLICATION

This U.S. non-provisional patent application claims priority under 35 U.S.C. §119 to Korean Patent Application No. 10-2014-0095938, filed on Jul. 28, 2014, in the Korean Intellectual Property Office, the disclosure of which is hereby incorporated by reference in its entirety.

BACKGROUND

The inventive concepts relate to image sensors. More particularly, the inventive concepts relate to complementary metal-oxide-semiconductor (CMOS) image sensors with improved performance.

An image sensor is a semiconductor device that converts an optical image into electrical signals. Image sensors may be categorized as any one of charge coupled device (CCD) image sensors and CMOS image sensors. CIS is an acronym for the CMOS image sensor. The CIS includes a plurality of two-dimensionally arranged pixels. Each of the pixels may include a photodiode that coverts incident light into an electrical signal.

SUMMARY

At least one example embodiment of the inventive concepts may provide image sensors capable of reducing, (or alternatively, minimizing or alternatively, preventing) crosstalk.

According to at least one example embodiment, an image sensor includes a substrate including a pixel region and a peripheral circuit region, and a first device isolation layer disposed in the substrate to define a plurality of unit pixels that are adjacent to each other in a first direction in the pixel region. Each of the plurality of unit pixels includes at least one light sensing element disposed in the substrate. The image sensor includes an interlayer insulating structure on the substrate, and a first blocking structure disposed on the first device isolation layer and penetrating the interlayer insulating structure. The first blocking structure is disposed between the plurality of unit pixels when viewed from a plan view. The first blocking structure extends in a second direction intersecting the first direction when viewed from a plan view.

According to at least one example embodiment, the first blocking structure includes a conductive material.

According to at least one example embodiment, each of the plurality of unit pixels comprises a pixel circuit. The pixel circuit comprises at least one gate electrode disposed adjacently to the at least one light sensing element on the substrate. The peripheral circuit region comprises a peripheral logic circuit. The pixel circuit is configured to output an electrical signal generated by the at least one light sensing element to the peripheral logic circuit. The first blocking structure is configured to receive a constant voltage during the output of the electrical signal.

According to at least one example embodiment, the interlayer insulating structure may include a first interlayer insulating layer. The first blocking structure may include a first pixel blocking plug penetrating the first interlayer insulating layer and being in contact with the first device isolation layer, and a first pixel blocking interconnection disposed on the first interlayer insulating layer and being in contact with the first pixel blocking plug.

According to at least one example embodiment, the interlayer insulating structure may further include a second interlayer insulating layer disposed on the first interlayer insulating layer. The first blocking structure may further include a second pixel blocking plug penetrating the second interlayer insulating layer and being in contact with the first pixel blocking interconnection, and a second pixel blocking interconnection disposed on the second interlayer insulating layer and being in contact with the second pixel blocking plug.

According to at least one example embodiment, the interlayer insulating structure may include a first interlayer insulating layer and a second interlayer insulating layer sequentially stacked. The first blocking structure may include a first pixel blocking interconnection disposed between the first interlayer insulating layer and the second interlayer insulating layer, a second pixel blocking interconnection disposed on the second interlayer insulating layer, and a pixel blocking plug disposed in the second interlayer insulating layer and connecting the first pixel blocking interconnection to the second pixel blocking interconnection.

According to at least one example embodiment, the image sensor may further include a first dummy conductive pattern disposed between the first device isolation layer and the first blocking structure. The first dummy conductive pattern may extend along the first blocking structure in the second direction when viewed from a plan view.

According to at least one example embodiment, the image sensor may further include a second device isolation layer disposed in the substrate to define active regions adjacent to each other in a third direction in the peripheral circuit region, and a second blocking structure disposed on the second device isolation layer and penetrating the interlayer insulating structure. The second blocking structure may extend in a fourth direction intersecting the third direction between the adjacent active regions when viewed from a plan view.

According to at least one example embodiment, the second blocking structure may include a conductive material.

According to at least one example embodiment, the interlayer insulating structure may include first and second interlayer insulating layers sequentially stacked. The second blocking structure may include a peripheral blocking plug penetrating the first interlayer insulating layer or the second interlayer insulating layer, and a peripheral blocking interconnection disposed on the first interlayer insulating layer or the second interlayer insulating layer. The peripheral blocking interconnection may be in contact with the peripheral blocking plug.

According to at least one example embodiment, the image sensor may further include a second dummy conductive pattern disposed between the second device isolation layer and the second blocking structure. The second dummy conductive pattern may extend along the second blocking structure in the fourth direction when viewed from a plan view.

According to at least one example embodiment, the first blocking structure may have a rectangular shape having a short axis parallel to the first direction and a long axis parallel to the second direction when viewed from a plan view.

According to at least one example embodiment, the first blocking structure may further include an extension extending from one end of the first blocking structure in the first direction or a direction opposite to the first direction.

According to at least one example embodiment, an image sensor includes a substrate including a pixel region and a peripheral circuit region, and a first device isolation layer disposed in the substrate to define a plurality of unit pixels that are adjacent to each other in a first direction in the pixel region. The image sensor includes a first blocking structure disposed on the first device isolation layer between the plurality of unit pixels, the first blocking structure extending in a second direction intersecting the first direction. The first blocking structure includes a conductive material. The peripheral circuit region comprises a peripheral logic circuit. Each of the plurality of unit pixels comprises at least one light sensing element configured to convert an optical signal corresponding to incident light into an electrical signal, and a pixel circuit configured to output the electrical signal to the peripheral logic circuit.

According to at least one example embodiment, the first blocking structure is configured to receive a constant voltage during the output of the electrical signal.

According to at least one example embodiment, the image sensor includes a second device isolation layer disposed in the substrate to define active regions adjacent to each other in a third direction in the peripheral circuit region. The image sensor includes a second blocking structure disposed on the second device isolation layer between the adjacent active regions, the second blocking structure extending in a fourth direction intersecting the third direction. The second blocking structure includes a conductive material, and the peripheral logic circuit comprises a peripheral circuit gate disposed on each of the active regions.

According to at least one example embodiment, the peripheral logic circuit is configured to receive the electrical signal outputted from the pixel circuit, and the second blocking structure is configured to receive a constant voltage while the peripheral logic circuit receives the electrical signal.

According to at least one example embodiment, the at least one light sensing element is disposed in the substrate of each of the plurality of unit pixels, and the pixel circuit comprises at least one gate electrode disposed adjacently to the at least one light sensing element on the substrate.

According to at least one example embodiment, an image sensor includes a substrate including a plurality of unit pixels connected to a plurality of peripheral circuits. The plurality of unit pixels are spaced apart from each other in a first direction, and the plurality of peripheral circuits being are spaced apart from each other in a second direction. The image sensor includes at least one interlayer insulating layer on the substrate, and a first blocking structure disposed between the plurality of unit pixels and penetrating the at least one interlayer insulating layer. The image sensor includes a second blocking structure disposed between the plurality of peripheral circuits and penetrating the at least one interlayer insulating layer. The first blocking structure extends in a third direction that intersects the first direction and the second blocking structure extends in a fourth direction that intersects the second direction.

According to at least one example embodiment, the at least one interlayer insulating layer includes a first interlayer insulating layer and a second interlayer insulating layer. The first blocking structure is conductive and includes a first plurality of plugs connected to a first plurality of interconnections, and the second blocking structure is conductive and includes a second plurality of plugs connected to a second plurality of interconnections.

According to at least one example embodiment, each of the plurality of unit pixels includes at least one light sensing element configured to convert sensed light into an electrical signal, and a pixel circuit configured to output the electrical signal to an associated one of the plurality of peripheral circuits.

According to at least one example embodiment, each of the plurality of peripheral circuits includes a sampling circuit configured to sample the electrical signal.

According to at least one example embodiment, the image sensor includes a voltage supply configured to apply a first constant voltage to the first blocking structure during operation of the pixel circuit and apply a second constant voltage to the second blocking structure during operation of the peripheral circuit.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
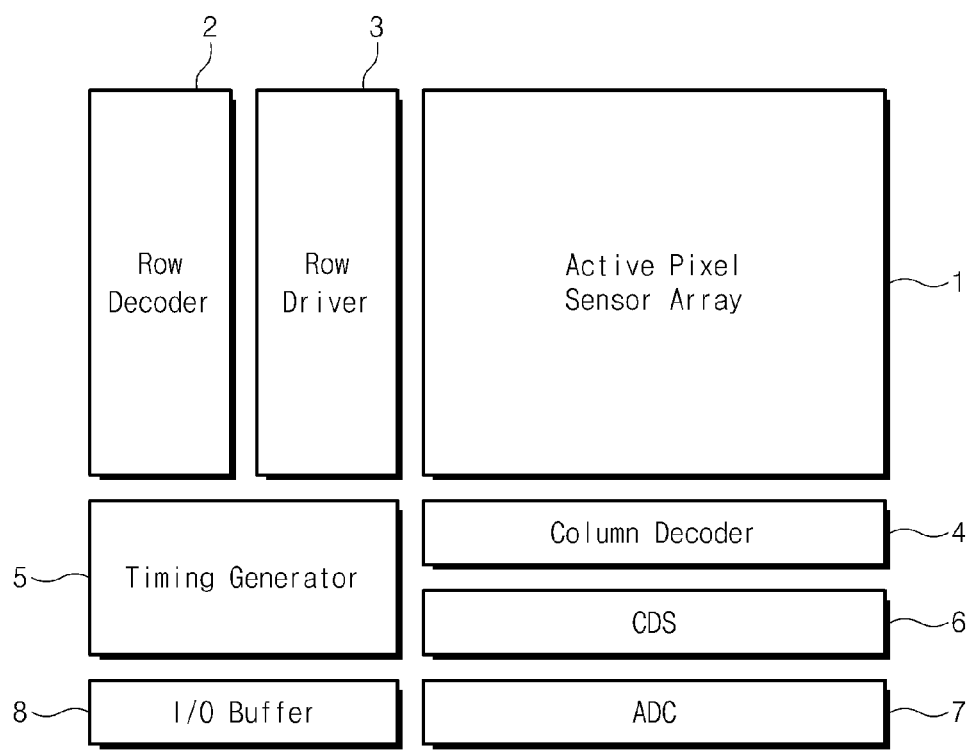
FIG. 1 is a schematic block diagram illustrating an image sensor according to at least one example embodiment of the inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Expressions such as "at least one of," when preceding a list of elements, modify the entire list of elements and do not modify the individual elements of the list.

Moreover, example embodiments are described herein with reference to cross-sectional illustrations and/or plane illustrations that may be idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not necessarily intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating an image sensor according to at least one example embodiment of the inventive concepts. FIG. 1 illustrates a complementary metal-oxide-semiconductor (CMOS) image sensor. However, the inventive concepts are not limited to the CMOS image sensor.

Referring to FIG. 1, the image sensor may include an active pixel sensor array 1, a row decoder 2, a row driver 3, a column decoder 4, a timing generator 5, a correlated double sampler 6, an analog-to-digital converter 7, and an input/output (I/O) buffer 8. The decoders 2 and 4, the row driver 3, the timing generator 5, the correlated double sampler 6, the analog-to-digital converter 7, and the I/O buffer 8 may constitute a peripheral logic circuit.

The active pixel sensor array 1 may include a plurality of unit pixels two-dimensionally arranged and may convert optical signals into electrical signals. The active pixel sensor array 1 may be driven by a plurality of driving signals provided from the row driver 3. For example, the driving signals may include a pixel selection signal, a reset signal, and a charge transfer signal. The converted electrical signals may be provided to the correlated double sampler (CDS) 6.

The row driver 3 may provide the driving signals for driving a plurality of unit pixels to the active pixel sensor array 1 according to results decoded in the row decoder 2. When the unit pixels are arranged in a matrix form including rows and columns, the driving signals may be provided to each row.

The timing generator 5 may provide a timing signal and a control signal to the row decoder 2 and the column decoder 4.

The correlated double sampler 6 may receive the electrical signals generated from the active pixel sensor array 1 to hold and sample the received electrical signals. In more detail, the correlated double sampler 6 may evaluate a difference between a reference voltage representing a reset state of the unit pixels and an output voltage representing a signal component corresponding to incident light by a capacitor and a switch, thereby performing correlated doubling sampling and outputting an analog sampling signal corresponding to an effective signal component. The correlated double sampler 6 may include a plurality of CDS circuits respectively connected to column lines of the active pixel sensor array 1 and may output the analog sampling signal corresponding to the effective signal component to each column.

The analog-to-digital converter (ADC) 7 may convert the analog signal corresponding to the difference level outputted from the correlated double sampler 6 into a digital signal and may output the converted digital signal.

The I/O buffer 8 may latch the digital signals, and the latched digital signals may be sequentially outputted as digital signals to an image signal processing part (not shown) in response to results decoded in the column decoder 4.

Figure 2:
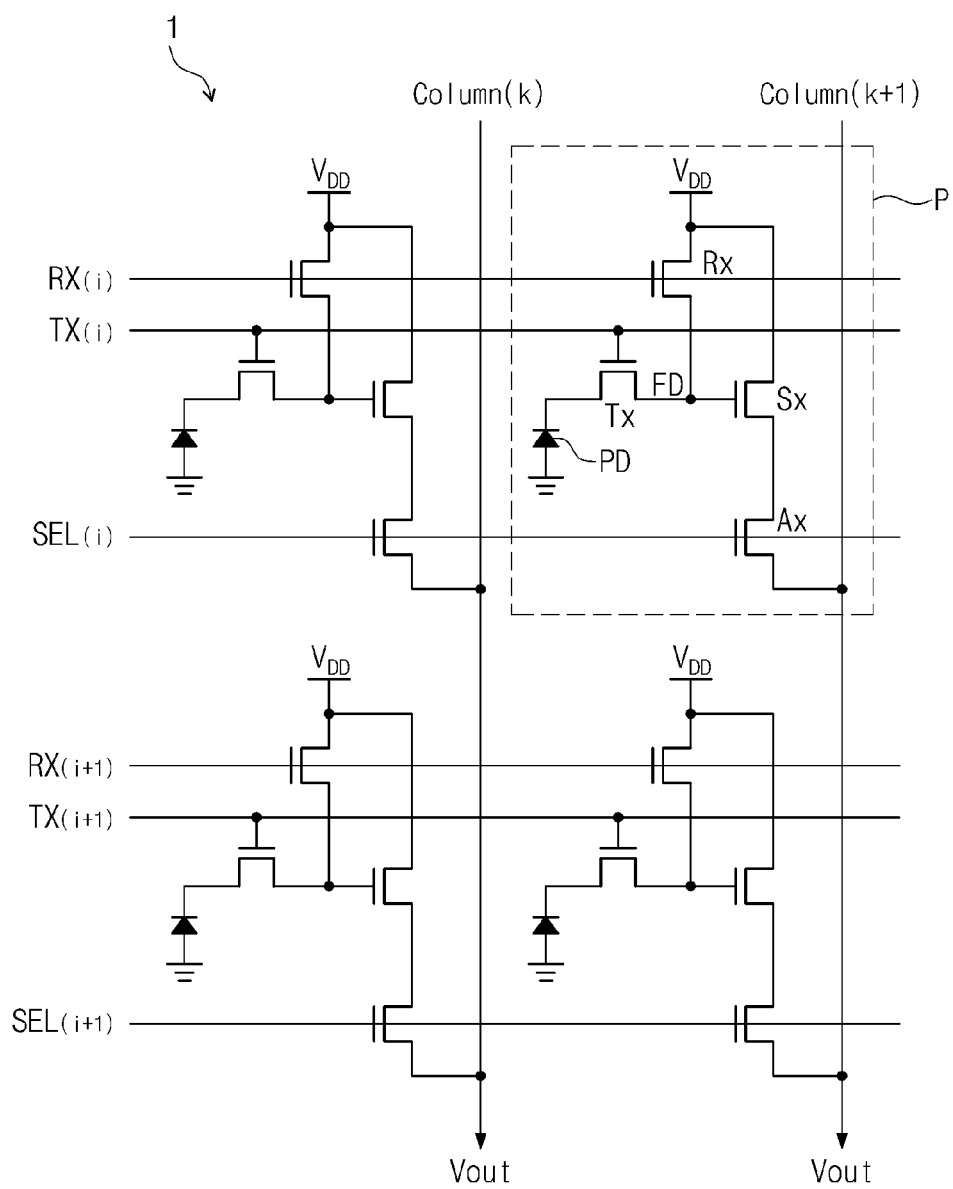
FIG. 2 is a circuit diagram illustrating an active pixel sensor array of an image sensor according to at least one example embodiment of the inventive concepts.

FIG. 2 is a circuit diagram illustrating an active pixel sensor array of an image sensor according to at least one example embodiment of the inventive concepts.

Referring to FIG. 2, the active pixel sensor array 1 may include a plurality of unit pixels P arranged in a matrix form. In at least one example embodiment, each unit pixel P that includes four N-type metal-oxide-semiconductor (NMOS) transistors may include a photoelectric conversion part (or light sensing element) PD and sensing (or switching) elements. The photoelectric conversion part PD may generate photo charges from received light and may accumulate the generated photo charges. The sensing elements may sense an optical signal incident on the photoelectric conversion part PD. The sensing elements may include a reset element Rx, an amplification element Sx, and a selection element Ax. FIG. 2 illustrates the unit pixel P including the four NMOS transistors. However, the inventive concepts are not limited thereto. In at least one example embodiment, the unit pixel P may include three NMOS transistors or five NMOS transistors.

The photoelectric conversion part PD may generate and accumulate the photo charges corresponding to the incident light. The photoelectric conversion part (or light sensing element) PD may include at least one of a photo diode, a photo transistor, a photo gate, or a pinned photo diode (PPD). In at least one example embodiment of the inventive concepts, the photo diode may be illustrated as the photoelectric conversion part PD. The photoelectric conversion part PD may be connected to a charge transfer element Tx that transfers the accumulated photo charges to a detection node (or floating diffusion node) FD. The charge transfer element Tx may include a gate electrode of one NMOS transistor and may be controlled by a charge transfer signal line TX (i).

The detection node FD may be a floating diffusion region FD and may receive the photo charges accumulated in the photoelectric conversion part PD. The detection node FD may cumulatively store charges. The detection node FD may be electrically connected to the amplification element Sx to control the amplification element Sx.

The reset element Rx may reset the detection node FD by periods and may be realized as one NMOS transistor. A source of the reset element Rx may be connected to the detection element FD, and a drain of the reset element Rx may be connected to a power voltage VDD. The reset element Rx may be driven by a bias provided through a reset signal line RX (i). If the reset element Rx is turned on by the bias provided through the reset signal line RX (i), the power voltage VDD connected to the drain of the reset element Rx may be transmitted to the detection node FD. Thus, the detection node FD may be reset when the reset element Rx is turned on.

The amplification element Sx may be combined with a constant current source (not shown) to act as a source follower buffer amplifier. The amplification element Sx may amplify an electrical potential of the detection node FD and may output the amplified electrical potential to a column line Column (k).

The selection element Ax may select a unit cell to be sensed. The selection element Ax may be driven by a bias provided through a row selection line SEL (i). If the selection element Ax is turned on, the power voltage VDD connected to the drain of the amplification element Sx may be transmitted to the drain of the selection element Ax.

The signal lines TX (i), RX (i), and SEL (i) for driving the charge transfer element TX, the reset element Rx and the selection element Ax may extend in a row direction (e.g., a horizontal direction) to drive the unit cells included in the same row at the same time.

Figure 3:
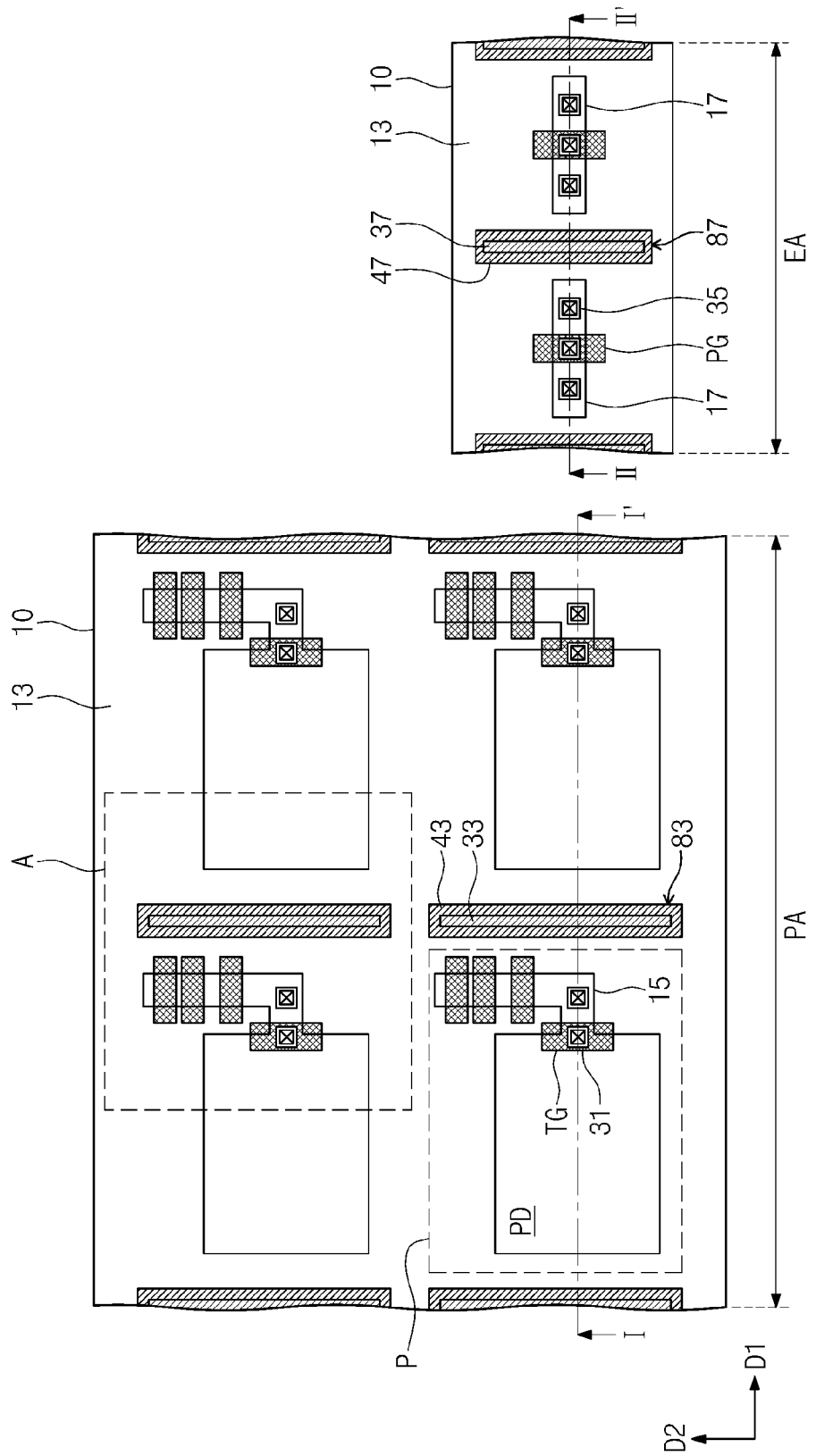
FIG. 3 is a plan view illustrating an image sensor according to at least one example embodiment of the inventive concepts.
Figure 4:
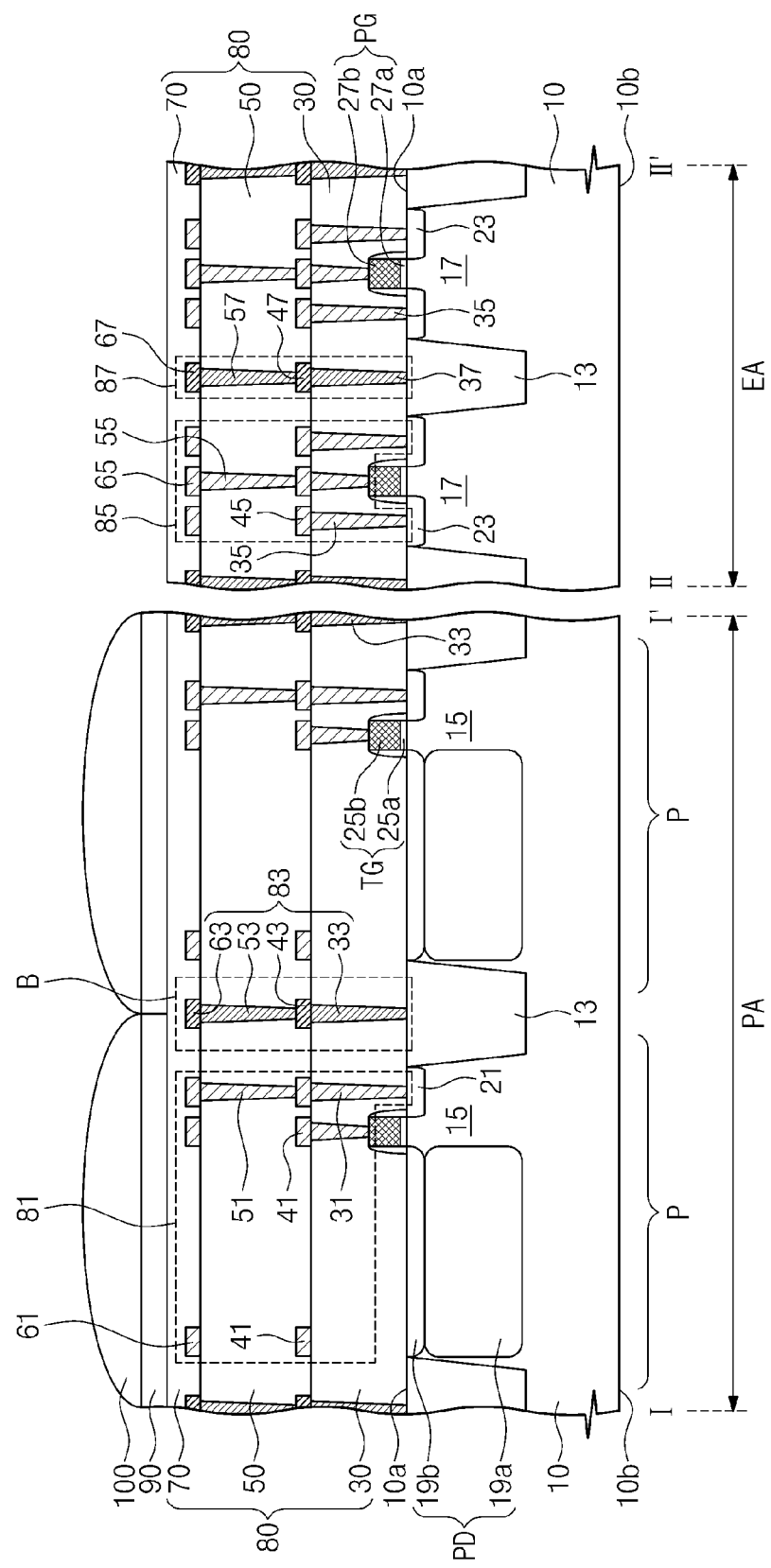
FIG. 4 is a cross-sectional view taken along lines I-I' and II-II' of FIG. 3.
Figure 5A:
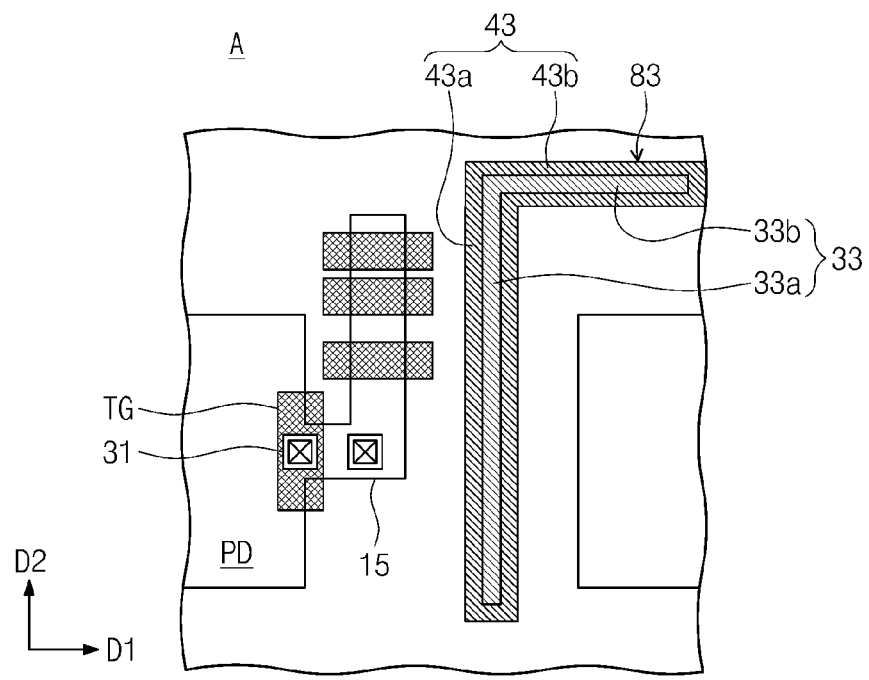
FIGS. 5A and 5B are enlarged views of a portion 'A' of FIG. 3.
Figure 5B:
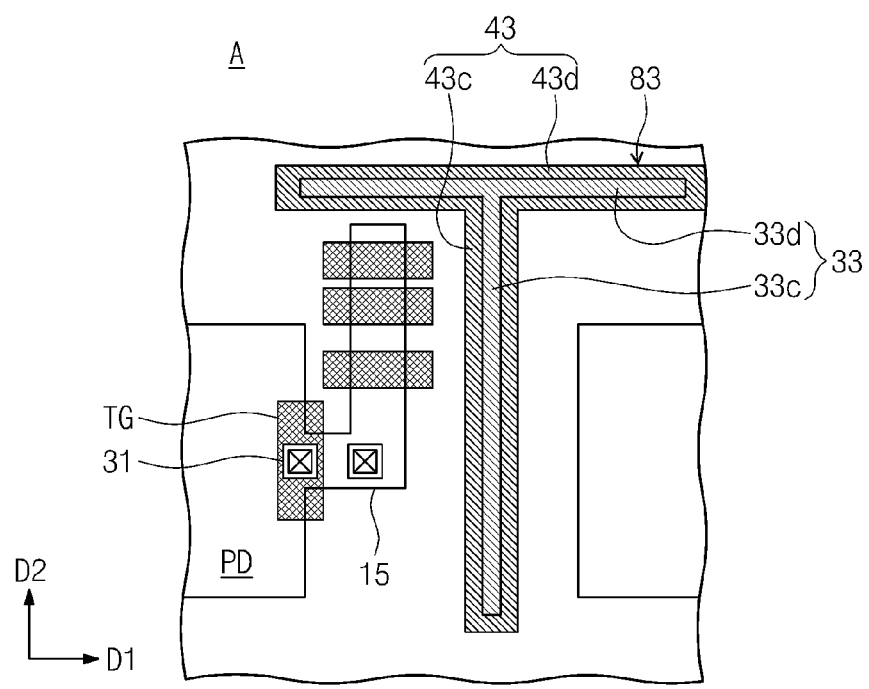
Figure 6A:
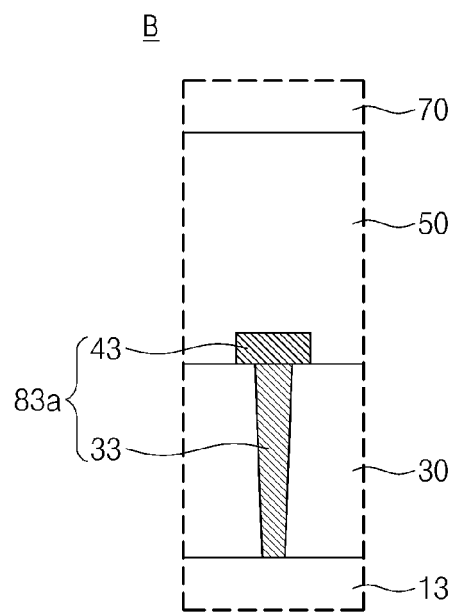
FIGS. 6A and 6B are enlarged views of a portion 'B' of FIG. 4.
Figure 6B:
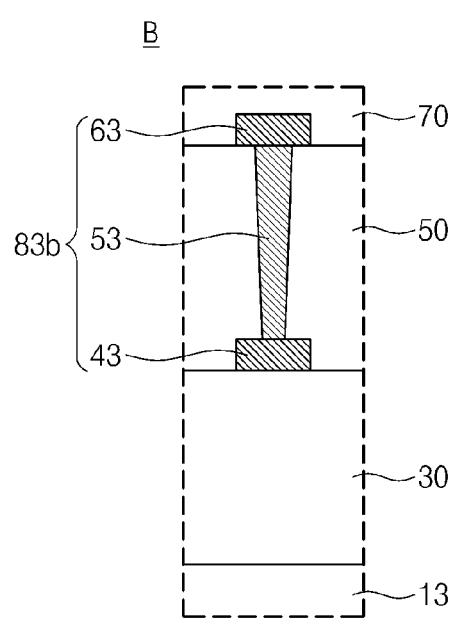

FIG. 3 is a plan view illustrating an image sensor according to at least one example embodiment of the inventive concepts, and FIG. 4 is a cross-sectional view taken along lines I-I' and II-II' of FIG. 3. FIGS. 5A and 5B are enlarged views of a portion 'A' of FIG. 3. FIGS. 6A and 6B are enlarged views of a portion 'B' of FIG. 4.

Referring to FIGS. 3 and 4, a substrate 10 including a pixel region PA and a peripheral circuit region EA may be provided. The substrate 10 may include a first surface 10a and a second surface 10b that are opposite to each other. The substrate 10 may be doped with, for example, P-type dopants. The substrate 10 may be a silicon wafer, a silicon-on-insulator (SOI) substrate, or a semiconductor epitaxial layer.

A device isolation layer 13 may be disposed in the substrate 10. The device isolation layer 13 disposed in the pixel region PA may define a plurality of first active regions 15 for a plurality of unit pixels P. In other words, the device isolation layer 13 in the pixel region PA may define the unit pixels P. The plurality of unit pixels P may be two-dimensionally arranged. In other words, the unit pixels P may be arranged along rows and columns. The rows may be parallel to a first direction D1, and the columns may be parallel to a second direction D2. The first direction D1 may correspond to the extending direction of the signal lines TX (i), RX (i), and SEL (i) of FIG. 2, and the second direction D2 may correspond to the extending direction of the column line Column (k). Each of the unit pixels P may include the pixel circuit described with reference to FIG. 2. In other words, the unit pixel P may include at least one MOS transistor.

The device isolation layer 13 disposed in the peripheral circuit region EA may define a second active region 17. The second active region 17 may be a plurality of second active regions. The plurality of second active regions 17 may have bar shapes horizontally spaced apart from each other. The peripheral circuit region EA may include the peripheral logic circuit described with reference to FIG. 1. For example, the peripheral circuit region EA may include sampling circuits, such as the CDS circuits (e.g., MOS transistors and capacitors) included in the correlated double sampler 6 of FIG. 1. FIG. 3 illustrates the second active regions 17 which are spaced apart from each other in the first direction D1 with the device isolation layer 13 interposed therebetween. However, the inventive concepts are not limited thereto. In at least one example embodiment, the second active regions 17 may be spaced apart from each other in the second direction D2 with the device isolation layer 13 interposed therebetween.

In at least one example embodiment, a photoelectric conversion part PD may be disposed in the substrate 10 of the unit pixel P. The photoelectric conversion part PD may be a photo diode. In at least one example embodiment, the photoelectric conversion part PD may include a first dopant region 19a and a second dopant region 19b. The first dopant region 19a may be deep from the first surface 10a of the substrate 10, and the second dopant region 19b may be shallow from the first surface 10a of the substrate 10. The first dopant region 19a and the second dopant region 19b may have conductivity types different from each other. For example, the first dopant region 19a may be doped with N-type dopants, and the second dopant region 19b may be doped with P-type dopants.

A floating diffusion region 21 may be disposed in the first active region 15. The floating diffusion region 21 may be spaced apart from the photoelectric conversion part PD in the first direction D1. The floating diffusion region 21 may be the detection element FD of FIG. 2. The floating diffusion region 21 may be doped with, for example, N-type dopants. The floating diffusion region 21 may consist of one doped region, and an area of the floating diffusion region 21 may be smaller than that of the photoelectric conversion part PD.

At least one gate may be disposed to be adjacent to the photoelectric conversion part PD on the substrate 10 of each of the unit pixels P. For example, a transfer gate TG may be disposed on the first surface 10a of the substrate 10 of the unit pixel P. The transfer gate TG may be adjacent to the floating diffusion region 21 and may be disposed on the first active region 15 between the photoelectric conversion part PD and the floating diffusion region 21. The transfer gate TG may include a transfer gate dielectric layer 25a and a transfer gate electrode 25b. The transfer gate dielectric layer 25a may include at least one of silicon oxide, silicon nitride, silicon oxynitride, or a high-k dielectric material (e.g., hafnium oxide). The transfer gate electrode 25b may include at least one of a doped semiconductor (e.g., doped silicon), a metal (e.g., tungsten), a conductive metal nitride (e.g., titanium nitride or tantalum nitride), a transition metal (e.g., titanium or tantalum), or a conductive metal-semiconductor compound (e.g., a metal silicide). The transfer gate TG may correspond to the charge transfer element TX of FIG. 2.

In the peripheral circuit region EA, a peripheral circuit gate PG may be disposed on the first surface 10a of the substrate 10. The peripheral circuit gate PG may be provided in plurality. The peripheral circuit gates PG may intersect or cross over the second active regions 17, respectively. In at least one example embodiment, the peripheral circuit gates PG may have a line or bar shape extending in the second direction D2. However, the inventive concepts are not limited thereto. In at least one other example embodiment, if the second active regions 17 are spaced apart from each other in the second direction D2, the peripheral circuit gates PG may have a line or bar shape extending in the first direction D1. Each of the peripheral circuit gates PG may include a peripheral circuit gate dielectric layer 27a and a peripheral circuit gate electrode 27b. The peripheral circuit gate dielectric layer 27a may include at least one of silicon oxide, silicon nitride, silicon oxynitride, or a high-k dielectric material (e.g., hafnium oxide). The peripheral circuit gate electrode 27b may include at least one of a doped semiconductor (e.g., doped silicon), a metal (e.g., tungsten), a conductive metal nitride (e.g., titanium nitride or tantalum nitride), a transition metal (e.g., titanium or tantalum), or a conductive metal-semiconductor compound (e.g., a metal silicide).

Third dopant regions 23 may be disposed in the second active region 17 at both sides of the peripheral circuit gate PG. The third dopant regions 23 may be source/drain regions. The peripheral circuit gate PG and the third dopant regions 23 at both sides of the peripheral circuit gate PG may constitute the MOS transistor of the CDS circuit described with reference to FIG. 1.

An interlayer insulating structure 80 may be disposed on the first surface 10a of the substrate 10. The interlayer insulating structure 80 may include a first interlayer insulating layer 30, a second interlayer insulating layer 50, and a third interlayer insulating layer 70. The first to third interlayer insulating layers 30, 50, and 70 may include at least one of an oxide (e.g., silicon oxide), a nitride (e.g., silicon nitride), or an oxynitride (e.g., silicon oxynitride). The interlayer insulating structure 80 including the first to third interlayer insulating layers 30, 50, and 70 are shown as an example in FIG. 4. However, the inventive concepts are not limited thereto.

A pixel interconnection structure 81 may be disposed in the interlayer insulating structure 80 of the unit pixel P. In at least one example embodiment, the pixel interconnection structure 81 may include first pixel interconnections 41 on the first interlayer insulating layer 30 and second pixel interconnections 61 on the second interlayer insulating layer 50. In addition, the pixel interconnection structure 81 may further include first pixel plugs 31 electrically connecting the first pixel interconnections 41 to a pixel circuit (e.g., the transfer gate TG and the floating diffusion region 21) and second pixel plugs 51 electrically connecting the first pixel interconnections 41 to the second pixel interconnections 61.

A plurality of peripheral interconnection structures 85 may be disposed in the interlayer insulating structure 80 of the peripheral circuit region EA. Each of the peripheral interconnection structures 85 may include first peripheral interconnections 45 on the first interlayer insulating layer 30 and second peripheral interconnections 65 on the second interlayer insulating layer 50. In addition, each of the peripheral interconnection structures 85 may further include first peripheral plugs 35 electrically connecting the first peripheral interconnections 45 to the peripheral logic circuit (e.g., the peripheral circuit gate PG and the third dopant regions 23) and second peripheral plugs 55 electrically connecting the first peripheral interconnections 45 to the second peripheral interconnections 65. The pixel circuit may be electrically connected to the peripheral logic circuit through the pixel interconnection structure 81 and the peripheral interconnection structure 85.

In the interlayer insulating structure 80 of the pixel region PA, a pixel blocking structure 83 may be disposed between the unit pixels P adjacent to each other in the first direction D1. In more detail, the pixel blocking structure 83 may be disposed on the device isolation layer 13 between the unit pixels P adjacent to each other in the first direction D1. The pixel blocking structure 83 may include a first pixel blocking plug 33 and a first pixel blocking interconnection 43. The first pixel blocking plug 33 may penetrate the first interlayer insulating layer 30 so as to be in contact with the device isolation layer 13. The first pixel blocking interconnection 43 may be disposed on the first interlayer insulating layer 30 so as to be in contact with a top surface of the first pixel blocking plug 33. In addition, the pixel blocking structure 83 may further include a second pixel blocking plug 53 and a second pixel blocking interconnection 63. The second pixel blocking plug 53 may penetrate the second interlayer insulating layer 50 so as to be in contact with the first pixel blocking interconnection 43. The second pixel blocking interconnection 63 may be disposed on the second interlayer insulating layer 50 so as to be in contact with a top surface of the second pixel blocking plug 53.

In at least one example embodiment, the first and second pixel blocking plugs 33 and 53 may extend in the second direction D2. In at least one example embodiment, each of the first and second pixel blocking plugs 33 and 53 may have a rectangular shape having a short axis parallel to the first direction D1 and a long axis parallel to the second direction D2 when viewed from a plan view. A length of each of the first and second pixel blocking plugs 33 and 53 in the second direction D2 may be greater than a length of the transfer gate TG in the second direction D2. In addition, the length of each of the first and second pixel blocking plugs 33 and 53 in the second direction D2 may be greater than a length of the photoelectric conversion part PD in the second direction D2.

The first and second pixel blocking interconnections 43 and 63 may extend in the second direction D2 like the first and second pixel blocking plugs 33 and 53. In other words, each of the first and second pixel blocking interconnections 43 and 63 may have a rectangular shape having a short axis parallel to the first direction D1 and a long axis parallel to the second direction D2 when viewed from a plan view. The first and second pixel blocking interconnections 43 and 63 may overlap with the first and second pixel blocking plugs 33 and 53 when viewed from a plan view. A length of each of the first and second pixel blocking interconnections 43 and 63 in the second direction D2 may be greater than the length of the transfer gate TG in the second direction D2. In addition, the length of each of the first and second pixel blocking interconnections 43 and 63 in the second direction D2 may be greater than the length of the photoelectric conversion part PD in the second direction D2.

The pixel blocking plugs 33 and 53 and the pixel blocking interconnections 43 and 63 may include a conductive material. Each of the pixel blocking plugs 33 and 53 and pixel blocking interconnections 43 and 63 may include at least one of a metal nitride (e.g., titanium nitride or tantalum nitride) and a metal material (e.g., titanium, tantalum, tungsten, copper, and/or aluminum).

The planar shape of the pixel blocking structure 83 described above may be variously changed as the need arises. FIGS. 5A and 5B illustrate modified example embodiments of the pixel blocking structure 83 having various planar shapes. However, the inventive concepts are not limited to the modified example embodiments of FIGS. 5A and 5B.

Referring to FIG. 5A, a planar shape of the pixel blocking structure 83 may have an 'L'-shape. For example, the first pixel blocking plug 33 may include a first portion 33a and a second portion 33b. When viewed from a plan view, the first portion 33a of the first pixel blocking plug 33 may extend in the second direction D2 between the unit pixels P adjacent to each other in the first direction D1, and the second portion 33b of the first pixel blocking plug 33 may extend from one end of the first portion 33a in the first direction D1. A planar shape of the first pixel blocking interconnection 43 may correspond to the planar shape of the first pixel blocking plug 33. In more detail, the first pixel blocking interconnection 43 may include a first portion 43a extending in the second direction D2 and a second portion 43b extending from one end of the first portion 43a in the first direction D1, when viewed from a plan view.

Referring to FIG. 5B, a planar shape of the pixel blocking structure 83 may have a 'T'-shape. For example, the first pixel blocking plug 33 may include a first portion 33c extending in the second direction D2 between the unit pixels P adjacent to each other in the first direction D1, and a second portion 33d extending from one end of the first portion 33c in the first direction D1 and a direction opposite to the first direction D1. A planar shape of the first pixel blocking interconnection 43 may correspond to the planar shape of the first pixel blocking plug 33. In more detail, the first pixel blocking interconnection 43 may include a first portion 43c extending in the second direction D2 and a second portion 43d extending from one end of the first portion 43c in the first direction D1 and the direction opposite to the first direction D1.

In addition, a vertical structure of the pixel blocking structure 83 described above may be variously modified. In at least one example embodiment, as illustrated in FIG. 6A, a pixel blocking structure 83a may not include the second pixel blocking plug 53 and the second pixel blocking interconnection 63 of FIG. 4. In other words, the pixel blocking structure 83a may consist of the first pixel blocking plug 33 disposed on the device isolation layer 13 and the first pixel blocking interconnection 43 disposed on the first pixel blocking plug 33. In at least one example embodiment, as illustrated in FIG. 6B, a pixel blocking structure 83b may include the first pixel interconnection 43 disposed between the first and second interlayer insulating layers 30 and 50, the second pixel interconnection 63 disposed on the second interlayer insulating layer 50, and the second pixel blocking plug 53 disposed between the first and second pixel interconnections 43 and 63. In other words, the pixel blocking structure 83b may not include the first pixel blocking plug 33 of the pixel blocking structure 83 illustrated in FIG. 4.

Even though not shown in the drawings, the planar shapes and vertical structures of the pixel blocking structures 83, 83a, and 83b of FIGS. 5A, 5B, 6A, and 6B may be combined in various forms.

Referring again to FIGS. 3 and 4, a peripheral blocking structure 87 may be disposed between the peripheral interconnection structures 85 adjacent to each other in the first direction D1 in the interlayer insulating structure 80 in the peripheral circuit region EA. In more detail, the peripheral blocking structure 87 may be disposed on the device isolation layer 13 between the second active regions 17 adjacent to each other in the first direction D1. The peripheral blocking structure 87 may include a first peripheral blocking plug 37 and a first peripheral blocking interconnection 47. The first peripheral blocking plug 37 may penetrate the first interlayer insulating layer 30 so as to be in contact with the device isolation layer 13. The first peripheral blocking interconnection 47 may be disposed on the first interlayer insulating layer 30 so as to be in contact with the first peripheral blocking plug 37. In addition, the peripheral blocking structure 87 may further include a second peripheral blocking plug 57 and a second peripheral blocking interconnection 67. The second peripheral blocking plug 57 may penetrate the second interlayer insulating layer 50 so as to be in contact with the first peripheral blocking interconnection 47. The second peripheral blocking interconnection 67 may be disposed on the second interlayer insulating layer 50 so as to be in contact with the second peripheral blocking plug 57.

In at least one example embodiment, the first and second peripheral blocking plugs 37 and 57 may extend in the second direction D2. In other words, each of the first and second peripheral blocking plugs 37 and 57 may have a rectangular shape having a short axis parallel to the first direction D1 and a long axis parallel to the second direction D2 when viewed from a plan view. A length of each of the first and second peripheral blocking plugs 37 and 57 in the second direction D2 may be greater than a length of the peripheral circuit gate PG in the second direction D2.

The first and second peripheral blocking interconnections 47 and 67 may extend in the second direction D2 like the first and second peripheral blocking plugs 37 and 57. In other words, each of the first and second peripheral blocking interconnections 47 and 67 may have a rectangular shape having a short axis parallel to the first direction D1 and a long axis parallel to the second direction D2 when viewed from a plan view. The first and second peripheral blocking interconnections 47 and 67 may overlap with the first and second peripheral blocking plugs 37 and 57 when viewed from a plan view. A length of each of the first and second peripheral blocking interconnections 47 and 67 in the second direction D2 may be greater than the length of the peripheral circuit gate PG in the second direction D2.

The peripheral blocking plugs 37 and 57 and the peripheral blocking interconnections 47 and 67 may include a conductive material. Each of the peripheral blocking plugs 37 and 57 and peripheral blocking interconnections 47 and 67 may include at least one of a metal nitride (e.g., titanium nitride or tantalum nitride) and a metal material (e.g., titanium, tantalum, tungsten, copper, and/or aluminum).

Even though not shown in the drawings, a planar shape and a vertical structure of the peripheral blocking structure 87 may be variously modified like the pixel blocking structures 83, 83a, and 83b illustrated in FIGS. 5A, 5B, 6A, and 6B.

Each of the pixel and peripheral blocking structures 83 and 87 may be connected to a power voltage VDD, a ground voltage, or other constant voltages from a voltage supply of the image sensor. Thus, a constant voltage may be applied to each of the pixel blocking structure 83 and peripheral blocking structure 87 during a desired (or alternatively, predetermined) operation of the image sensor.

In at least one example embodiment, a color filter array 90 may be disposed on the third interlayer insulating layer 70 of the pixel region PA. The color filter array 90 may include red, green, and blue color filters that are arranged in a Bayer pattern form. A micro lens array 100 may be disposed on the color filter array 90. In this case, light may be inputted into the photoelectric conversion part PD through the micro lens array 100, the color filter array 90, the interlayer insulating structure 80, and the first surface 10a. This image sensor may be a front-side illuminated image sensor.

While an optical signal is converted into an electrical signal in the unit pixel P and the electrical signal is outputted to the column line through the pixel interconnection structure 81, interference (or crosstalk) may be caused between the unit pixels P adjacent to each other in the row direction. Thus, the electrical signal may be distorted. This interference or crosstalk may be caused by a coupling effect between pixel interconnection structures 81 adjacent to each other in the row direction. In other words, a parasitic capacitance may occur between the adjacent pixel interconnection structures 81 to cause the interference or crosstalk phenomenon. According to at least one example embodiment of the inventive concepts, the pixel blocking structure 83 may be disposed between the unit pixels P adjacent to each other in the row direction. The pixel blocking structure 83 may be formed of the conductive material, and the constant voltage may be applied to the pixel blocking structure 83 during the operation of the image sensor. In other words, the constant voltage may be applied to the pixel blocking structure 83 while the electrical signal corresponding to incident light is outputted to the column line through the pixel interconnection structure 81. Thus, the coupling effect between the unit pixels P adjacent in the row direction may be minimized or prevented. This means that the crosstalk between the unit pixels P adjacent in the row direction may be reduced (or alternatively, minimized or alternatively, prevented).

On the other hand, each of the CDS circuits of the correlated double sampler disposed in the peripheral circuit region EA may be electrically connected to the column line of each of the unit pixels P through the peripheral interconnection structure 85. While, the CDS circuits perform a correlated double sampling operation, an interference or crosstalk phenomenon may occur between the peripheral interconnection structures 85 adjacent to each other to distort the electrical signal outputted from the column line. However, according to at least one example embodiment of the inventive concepts, the peripheral blocking structure 87 formed of the conductive material may be disposed between the adjacent peripheral interconnection structures 85. In addition, the constant voltage may be applied to the peripheral blocking structure 87 during the correlated double sampling operation. Thus, the coupling effect between the adjacent peripheral interconnection structures 85 may be reduced (or alternatively, minimized or alternatively, prevented) to improve the distortion phenomenon of the electrical signal outputted from the column line. As a result, it is possible to realize or provide the image sensor of which the crosstalk is reduced (or alternatively, minimized or alternatively, prevented).

FIGS. 7 to 10 are cross-sectional views corresponding to lines I-I' and II-II' of FIG. 3 to illustrate a method of fabricating an image sensor according to at least one example embodiment of the inventive concepts.

Figure 7:
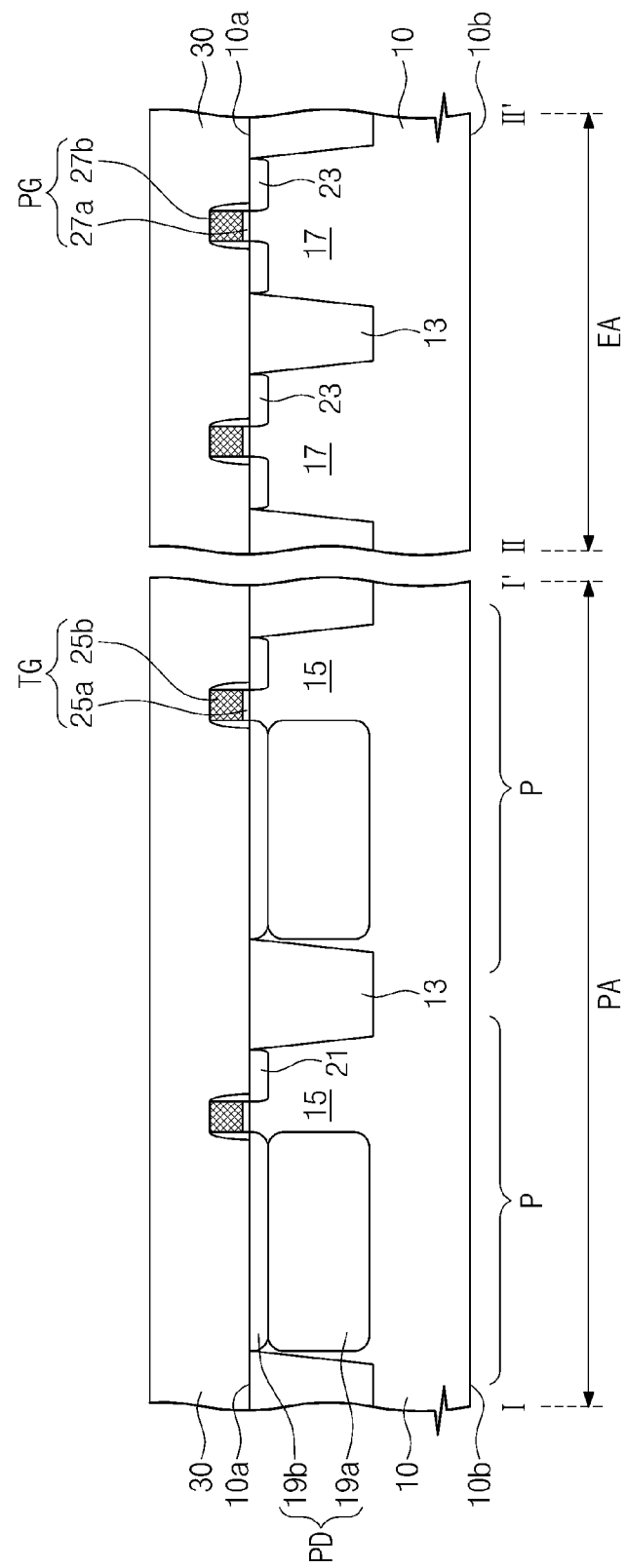
FIGS. 7 to 10 are cross-sectional views corresponding to lines I-I' and II-II' of FIG. 3 to illustrate a method of fabricating an image sensor according to at least one example embodiment of the inventive concepts.

Referring to FIG. 7, a substrate 10 including a pixel region PA and a peripheral circuit region EA may be provided. The substrate 10 may include a first surface 10a and a second surface 10b that are opposite to each other. For example, the substrate 10 may be doped with P-type dopants. The substrate 10 may be a silicon wafer, a silicon-on-insulator (SOI) substrate, or a semiconductor epitaxial layer.

A device isolation layer 13 may be formed in the substrate 10. The device isolation layer 13 formed in the pixel region PA may define a plurality of first active regions 15 for a plurality of unit pixels P. The plurality of unit pixels P may be two-dimensionally arranged. The device isolation layer 13 formed in the peripheral circuit region EA may define second active regions 17. In at least one example embodiment, a device isolation trench may be formed in the substrate 10, and the device isolation layer 13 may be formed by filling the device isolation trench with an oxide (e.g., silicon oxide).

A transfer gate TG and a peripheral circuit gate PG may be formed on the first surface 10a of the substrate 10. In more detail, the transfer gates TG may be formed in each of the unit pixels P, and the peripheral circuit gate PG may be formed on each of the second active regions 17 of the peripheral circuit region EA. In at least one example embodiment, a gate dielectric layer and a gate electrode layer may be sequentially formed on the first surface 10a of the substrate 10, and the gate electrode layer and the gate dielectric layer may be patterned to form the transfer gate TG and the peripheral circuit gate PG. The transfer gate TG may include a transfer gate dielectric layer 25a and a transfer gate electrode 25b. The peripheral circuit gate PG may include a peripheral circuit gate dielectric layer 27a and a peripheral circuit gate electrode 27b. The gate dielectric layer may include at least one of silicon oxide, silicon nitride, silicon oxynitride, or a high-k dielectric material (e.g., hafnium oxide). The gate electrode layer may include at least one of a doped semiconductor (e.g., doped silicon), a metal (e.g., tungsten), a conductive metal nitride (e.g., titanium nitride or tantalum nitride), a transition metal (e.g., titanium or tantalum), or a conductive metal-semiconductor compound (e.g., a metal silicide).

Ion implantation processes may be performed on the first surface 10a of the substrate 10 to form a photoelectric conversion part PD and a floating diffusion region 21 in the substrate 10 of each of the unit pixels P. In addition, third dopant regions 23 may be formed in the substrate 10 (i.e., the second active region) at both sides of the peripheral circuit gate PG. The third dopant regions 23 may be source/drain regions.

In at least one example embodiment, the photoelectric conversion part PD may include a first dopant region 19a and a second dopant region 19b. The first dopant region 19a may be deep from the first surface 10a, and the second dopant region 19b may be shallow from the first surface 10a. The first dopant region 19a and the second dopant region 19b may have conductivity types different from each other. For example, the first dopant region 19a may be doped with N-type dopants, and the second dopant region 19b may be doped with P-type dopants.

The floating diffusion region 21 may be spaced apart from the photoelectric conversion part PD and may be formed in the substrate at a side of the transfer gate TG. The floating diffusion region 21 may be doped with, for example, N-type dopants. The floating diffusion region 21 may consist of one doped region. An area of the floating diffusion region 21 may be smaller than that of the photoelectric conversion part PD.

Next, a first interlayer insulating layer 30 may be formed on the first surface 10a of the substrate 10. The first interlayer insulating layer 30 may cover the transfer gates TG and the peripheral circuit gates PG. The first interlayer insulating layer 30 may include at least one of an oxide (e.g., silicon oxide), a nitride (e.g., silicon nitride), or an oxynitride (e.g., silicon oxynitride).

Figure 8:
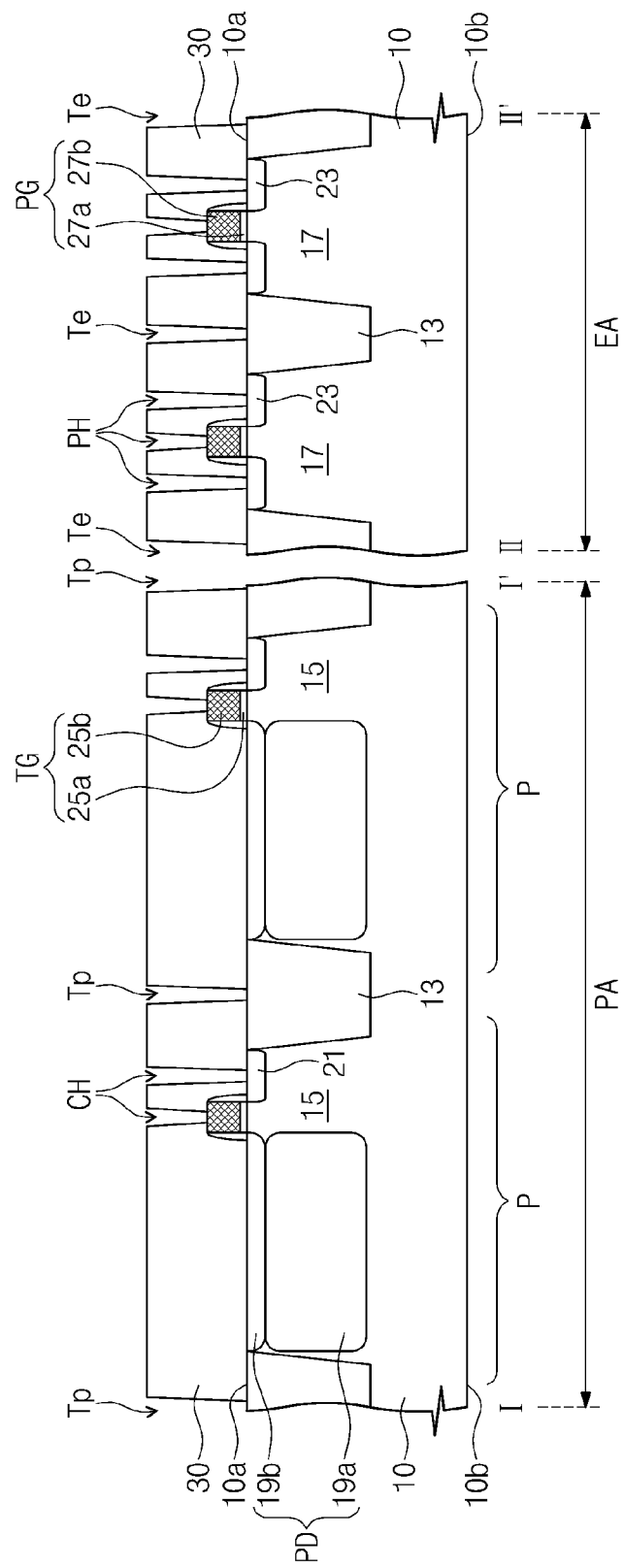

Referring to FIG. 8, pixel contact holes CH and pixel blocking trenches Tp may be formed in the first interlayer insulating layer 30 of the pixel region PA. In addition, peripheral contact holes PH and peripheral blocking trenches Te may be formed in the first interlayer insulating layer 30 of the peripheral circuit region EA.

Each of the pixel contact holes CH may expose the transfer gate TG or the floating diffusion region 21 of each unit pixel P. A horizontal section of the pixel contact hole CH may have a circular shape or a polygonal shape. An area of the horizontal section of the pixel contact hole CH may be smaller than those of horizontal sections of the transfer gate TG and floating diffusion region 21. The pixel blocking trench Tp may expose a top surface of the device isolation layer 12 between the unit pixels P adjacent to each other in the first direction D1 of FIG. 3. In at least one example embodiment, the pixel blocking trench Tp may extend in the second direction D2 of FIG. 3. In other words, the pixel blocking trench Tp may have a rectangular shape having a short axis parallel to the first direction D1 and a long axis parallel to the second direction D2 when viewed from a plan view.

Each of the peripheral contact holes PH may expose the peripheral circuit gate PG or the third dopant region 23 disposed at each side of the peripheral circuit gate PG. A horizontal section of the peripheral contact hole PH may have a circular shape or a polygonal shape. An area of the horizontal section of the peripheral contact hole PH may be smaller than those of horizontal sections of the peripheral circuit gate PG and the third dopant region 23. The peripheral blocking trench Te may expose a top surface of the device isolation layer 13 between the second active regions 17 adjacent to each other in the first direction D1 of FIG. 3. In at least one example embodiment, the peripheral blocking trench Te may extend in the second direction D2 of FIG. 3. In other words, the peripheral blocking trench Te may have a rectangular shape having a short axis parallel to the first direction D1 and a long axis parallel to the second direction D2 when viewed from a plan view.

In at least one example embodiment, a mask pattern (not shown) may be formed on the first interlayer insulating layer 30, and the first interlayer insulating layer 30 may be etched using the mask pattern as an etch mask to form the pixel contact holes CH, the pixel blocking trenches Tp, the peripheral contact holes PH, and the peripheral blocking trenches Te.

Figure 9:
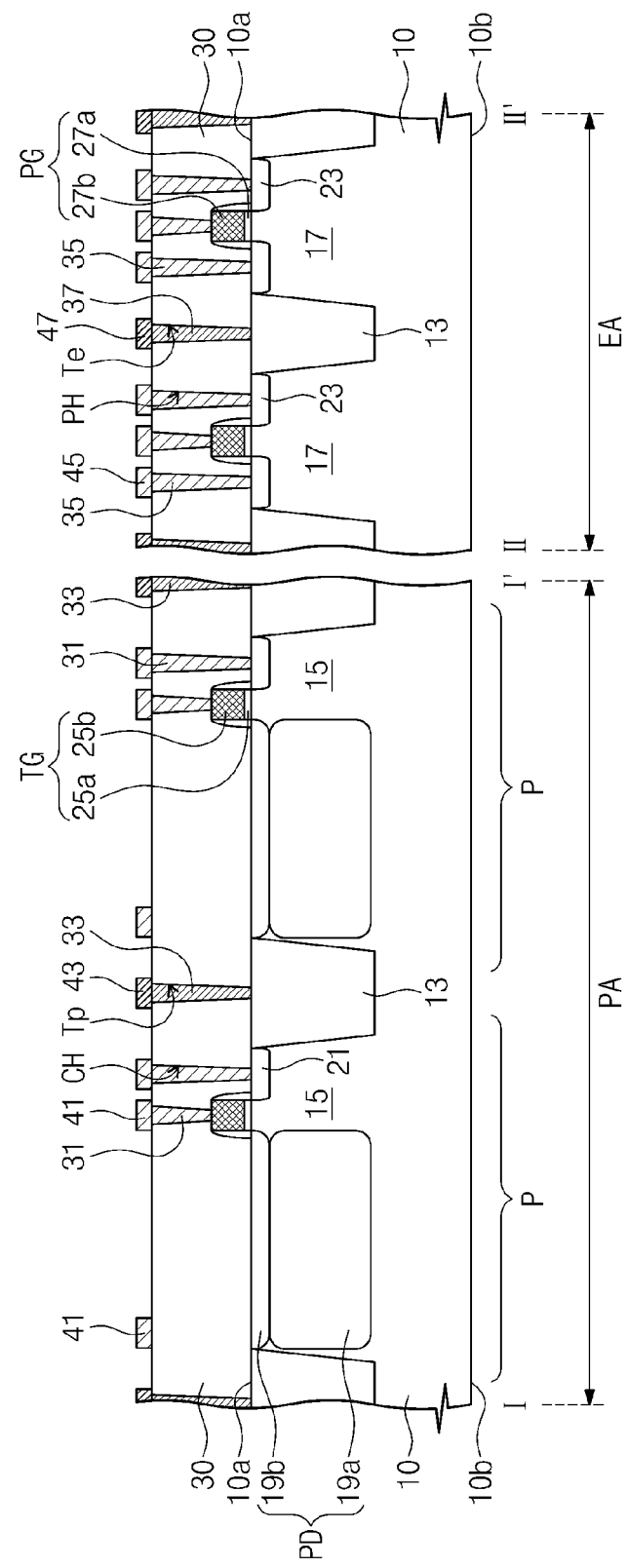

Referring to FIG. 9, first pixel plugs 31 and first pixel blocking plugs 33 may be formed in the pixel contact holes CH and the pixel blocking trenches Tp, respectively. First peripheral plugs 35 and first peripheral blocking plugs 37 may be formed in the peripheral contact holes PH and the peripheral blocking trenches Te, respectively. In at least one example embodiment, a conductive material may be formed to fill the contact holes CH and PH and the blocking trenches Tp and Te, and a planarization process may be performed on the conductive material to form the plugs 31, 33, 35, and 37. In at least one example embodiment, the first pixel plugs 31, the first pixel blocking plugs 33, the first peripheral plugs 35, and the first peripheral blocking plugs 37 may be formed of the same material. The conductive material may include at least one of a metal nitride (e.g., titanium nitride or tantalum nitride) and a metal material (e.g., titanium, tantalum, tungsten, copper, and/or aluminum).

Subsequently, first pixel interconnections 41 and first pixel blocking interconnections 43 may be formed on the first interlayer insulating layer 30 of the pixel region PA. First peripheral interconnections 45 and first peripheral blocking interconnections 47 may be formed on the first interlayer insulating layer 30 of the peripheral circuit region EA. Some of the first pixel interconnections 41 may be connected to the first pixel plugs 31. The first pixel blocking interconnections 43 may be connected to the first pixel blocking plugs 33. Likewise, some of the first peripheral interconnections 45 may be connected to the first peripheral plugs 35, and the first peripheral blocking interconnections 47 may be connected to the first peripheral plugs 37. Planar shapes of the first pixel blocking interconnections 43 and planar shapes of the first peripheral blocking interconnections 47 may correspond to the planar shapes of the first pixel blocking plugs 33 and the planar shapes of the first peripheral blocking plugs 37, respectively. In other words, each of the first pixel blocking interconnections 43 and first peripheral blocking interconnections 47 may have a line shape extending in the second direction D2 of FIG. 3.

A conductive layer may be formed on the first interlayer insulating layer 30, and a patterning process may be performed on the conductive layer to form the interconnections 41, 43, 45, and 47. In at least one example embodiment, the first pixel interconnections 41, the first pixel blocking interconnections 43, the first peripheral interconnections 45, and the first peripheral blocking interconnections 47 may be formed of the same material. The conductive layer may include at least one of a metal nitride (e.g., titanium nitride or tantalum nitride) and a metal material (e.g., titanium, tantalum, tungsten, copper, and/or aluminum).

Figure 10:
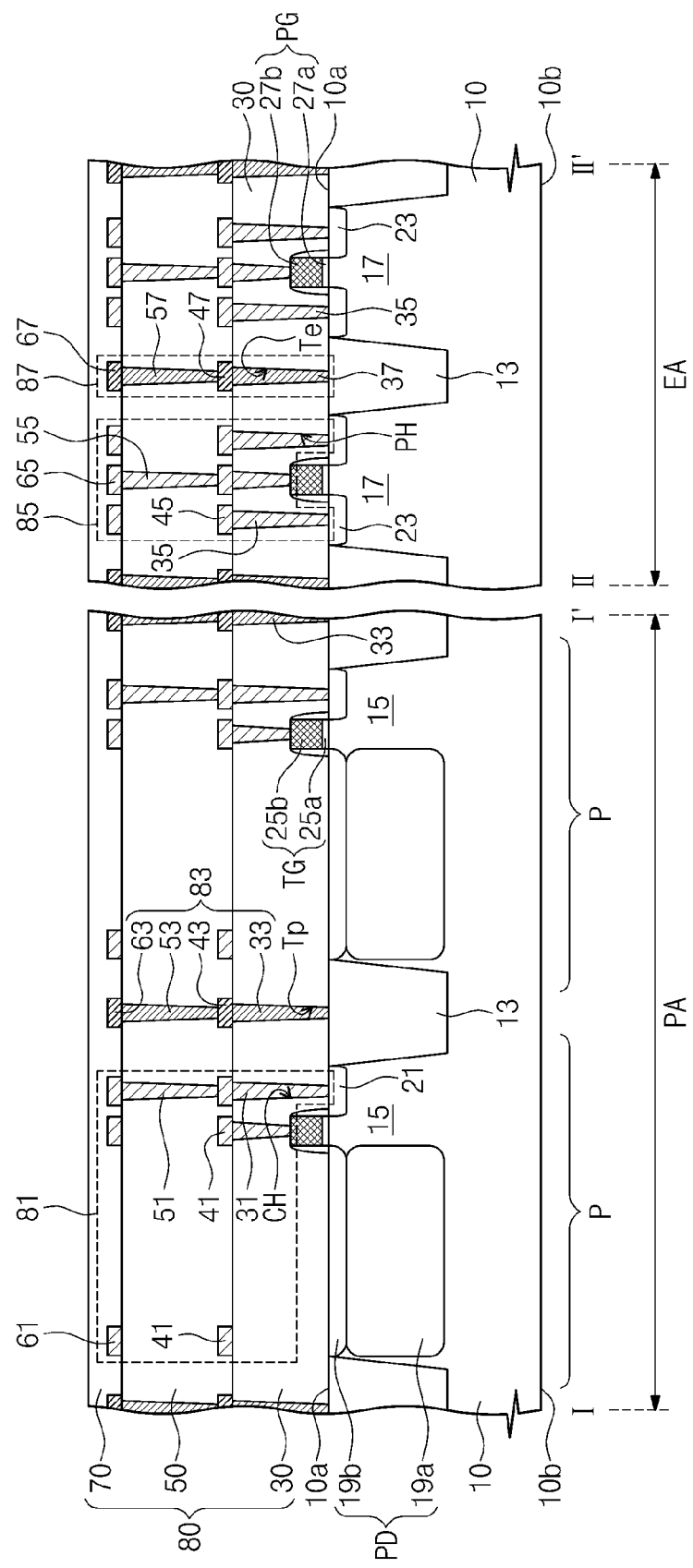

Referring to FIG. 10, a second interlayer insulating layer 50 may be formed on the first interlayer insulating layer 30. The second interlayer insulating layer 50 may cover the first pixel interconnections 41, the first pixel blocking interconnections 43, the first peripheral interconnections 45, and the first peripheral blocking interconnections 47. Second pixel plugs 51, second pixel blocking plugs 53, second peripheral plugs 55, and second peripheral blocking plugs 57 may be formed in the second interlayer insulating layer 50. A method of forming the second pixel plugs 51 and the second pixel blocking plugs 53 of the pixel region PA may be the substantially same as the method of forming the first pixel plugs 31 and the first pixel blocking plugs 33 described with reference to FIG. 9. Likewise, a method of forming the second peripheral plugs 55 and the second peripheral blocking plugs 57 of the peripheral circuit region EA may be the substantially same as the method of forming the first peripheral plugs 35 and the first peripheral blocking plugs 37 described with reference to FIG. 9. In at least one example embodiment, the second pixel plugs 51, the second pixel blocking plugs 53, the second peripheral plugs 55, and the second peripheral blocking plugs 57 may be formed of the same material and may include at least one of a metal nitride (e.g., titanium nitride or tantalum nitride) and a metal material (e.g., titanium, tantalum, tungsten, copper, and/or aluminum).

Next, second pixel interconnections 61, second pixel blocking interconnections 63, second peripheral interconnections 65, and second peripheral blocking interconnections 67 may be formed on the second interlayer insulating layer 50. A method of forming the second pixel interconnections 61, the second pixel blocking interconnections 63, the second peripheral interconnections 65, and the second peripheral blocking interconnections 67 may be the substantially same as the method of forming the first pixel interconnections 41, the first pixel blocking interconnections 43, the first peripheral interconnections 45, and the first peripheral blocking interconnections 47 described with reference to FIG. 9. In at least one example embodiment, the second pixel interconnections 61, the second pixel blocking interconnections 63, the second peripheral interconnections 65, and the second peripheral blocking interconnections 67 may be formed of the same material and may include at least one of a metal nitride (e.g., titanium nitride or tantalum nitride) and a metal material (e.g., titanium, tantalum, tungsten, copper, and/or aluminum). Here, the first and second pixel plugs 31 and 51 and the first and second pixel interconnections 41 and 61 may constitute a pixel interconnection structure 81, and the first and second pixel blocking plugs 33 and 53 and the first and second pixel blocking interconnections 43 and 63 may constitute a pixel blocking structure 83. Likewise, the first and second peripheral plugs 35 and 55 and the first and second peripheral interconnections 45 and 65 may constitute a peripheral interconnection structure 85, and the first and second peripheral blocking plugs 37 and 57 and the first and second peripheral blocking interconnections 47 and 67 may constitute a peripheral blocking structure 87.

A third interlayer insulating layer 70 may be formed on the second interlayer insulating layer 50 to cover the second pixel interconnections 61, the second pixel blocking interconnections 63, the second peripheral interconnections 65, and the second peripheral blocking interconnections 67. Each of the second and third interlayer insulating layers 50 and 70 may include at least one of an oxide (e.g., silicon oxide), a nitride (e.g., silicon nitride), or an oxynitride (e.g., silicon oxynitride). The first to third interlayer insulating layers 30, 50, and 70 may constitute an interlayer insulating structure 80.

Referring again to FIG. 4, a color filter array 90 may be formed on the third interlayer insulating layer 70 of the pixel region PA. The color filter array 90 may include red, green, and blue color filters that are arranged in a Bayer pattern form. Subsequently, a micro lens array 100 may be formed on the color filter array 90.

Figure 11:
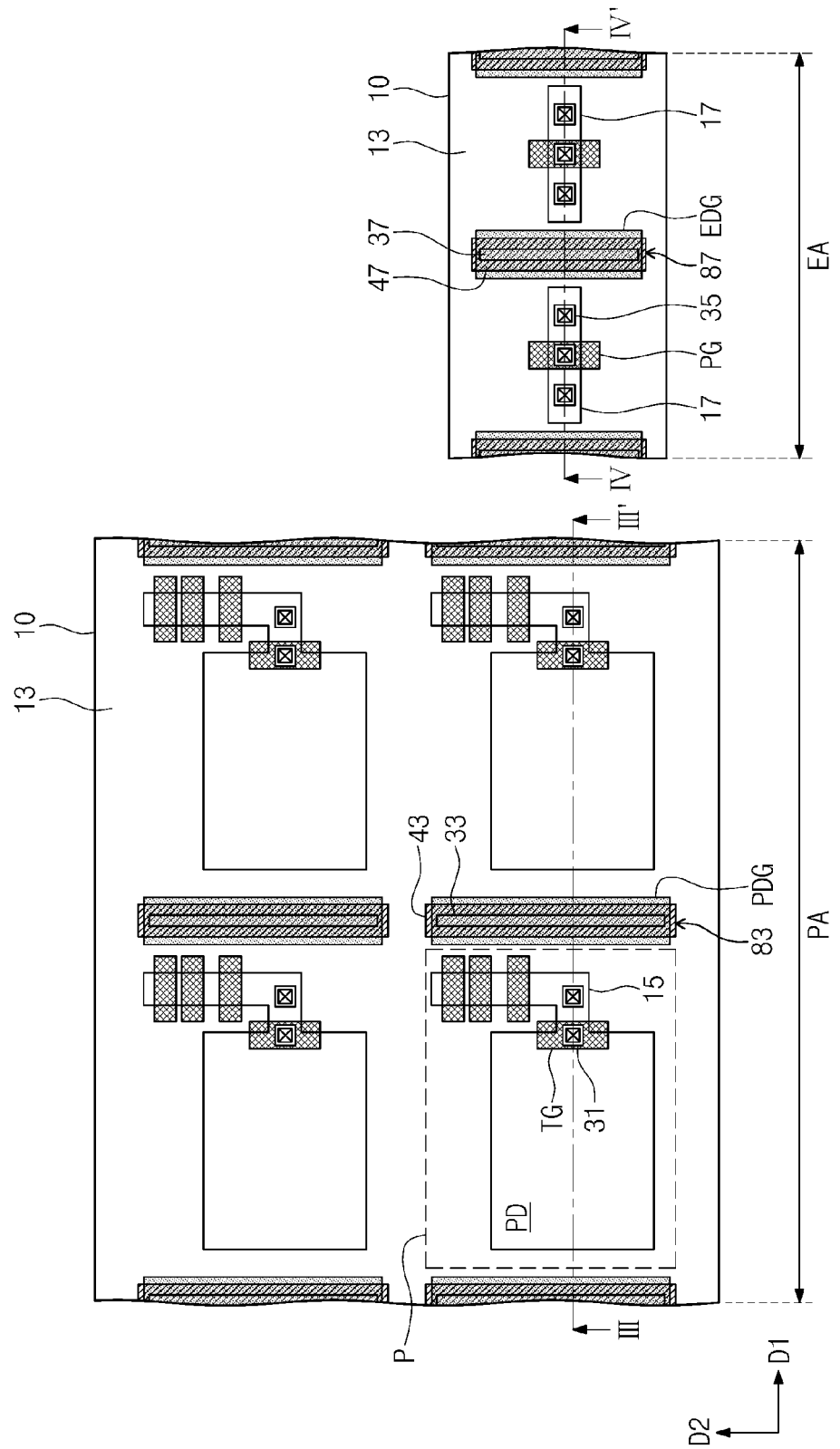
FIG. 11 is a plan view illustrating an image sensor according to at least one example embodiment of the inventive concepts.
Figure 12:
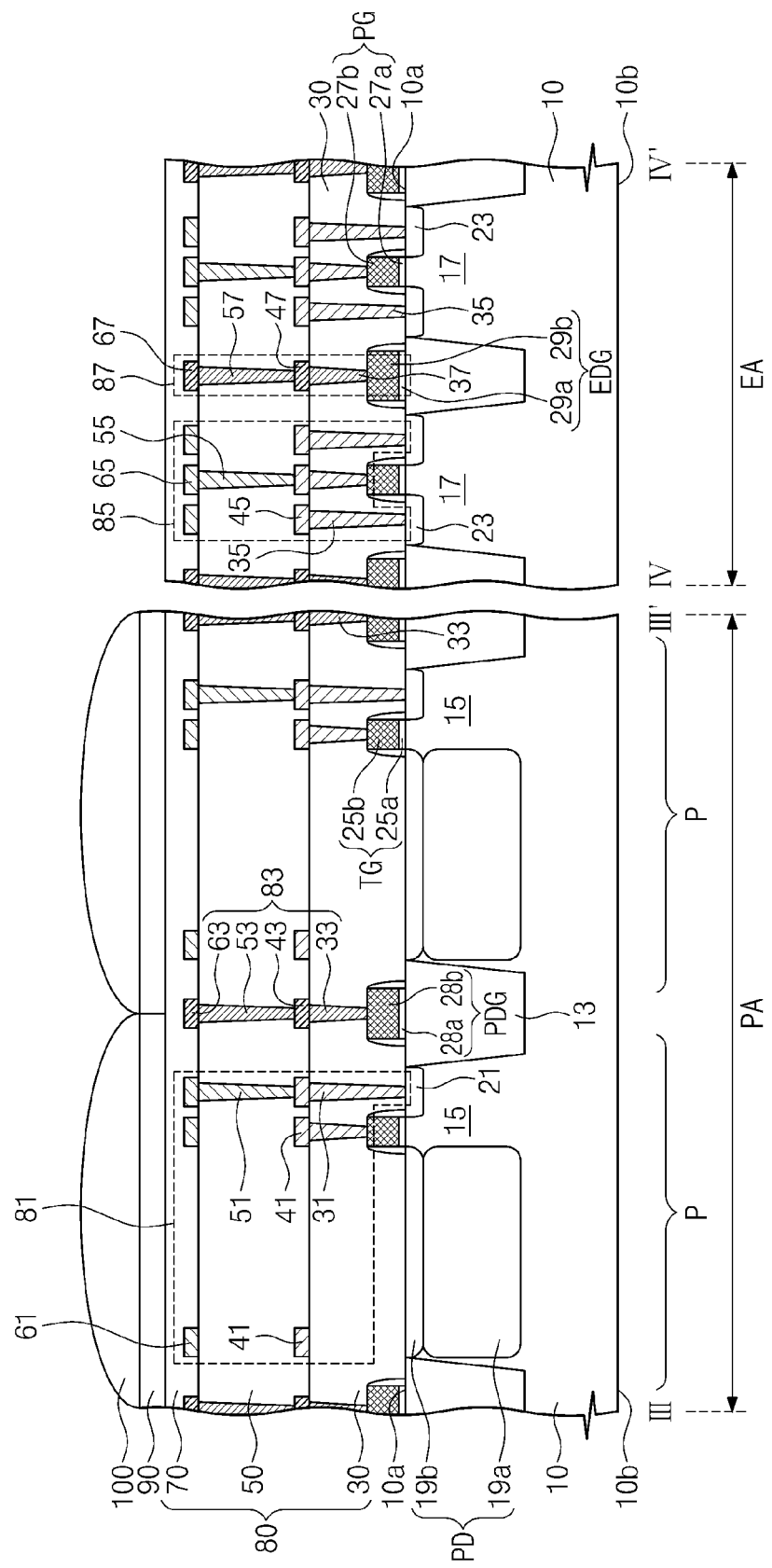
FIG. 12 is a cross-sectional view taken along lines III-III' and IV-IV' of FIG. 11.

FIG. 11 is a plan view illustrating an image sensor according to at least one example embodiment of the inventive concepts, and FIG. 12 is a cross-sectional view taken along lines III-III' and IV-IV' of FIG. 11. In an image sensor of FIGS. 11 and 12, a pixel dummy conductive pattern may be disposed between the pixel blocking structure and the device isolation layer. Other elements of the image sensor of FIGS. 11 and 12 except the pixel dummy conductive pattern may be the substantially same as corresponding elements of the image sensor illustrated in FIGS. 3 and 4. In the description of FIGS. 11 and 12 below, the descriptions of the same elements described in the example embodiment of FIGS. 3 and 4 will be omitted for the purpose of ease and convenience in explanation.

Referring to FIGS. 11 and 12, a pixel dummy conductive pattern PDG may be disposed on the device isolation layer 13 between the unit pixels P adjacent to each other in the first direction D1, and the pixel blocking structure 83 may be disposed on the pixel dummy conductive pattern PDG. In other words, the pixel dummy conductive pattern PDG may be disposed between the device isolation layer 13 and the pixel blocking structure 83. The pixel dummy conductive pattern PDG may extend along the pixel blocking structure 83 in the second direction D2. The pixel dummy conductive pattern PDG may overlap with the pixel blocking structure 83 when viewed from a plan view. In at least one example embodiment, the pixel dummy conductive pattern PDG may include a pixel dummy dielectric layer 28a and a pixel dummy electrode 28b. The pixel dummy dielectric layer 28a may include the same material as the transfer gate dielectric layer 25a, and the pixel dummy electrode 28b may include the same material as the transfer gate electrode 25b.

In the peripheral circuit region EA, a peripheral dummy conductive pattern EDG may be disposed on the device isolation layer 13 between the second active regions 17 adjacent to each other in the first direction D1. The peripheral blocking structure 87 may be disposed on the peripheral dummy conductive pattern EDG. In other words, the peripheral dummy conductive pattern EDG may be disposed between the device isolation layer 13 and the peripheral blocking structure 87. The peripheral dummy conductive pattern EDG may extend along the peripheral blocking structure 87 in the second direction D2. In other words, the peripheral dummy conductive pattern EDG may overlap with the peripheral blocking structure 87 when viewed from a plan view. In at least one example embodiment, the peripheral dummy conductive pattern EDG may include a peripheral dummy dielectric layer 29a and a peripheral dummy electrode 29b. The peripheral dummy dielectric layer 29a may include the same material as the peripheral circuit gate dielectric layer 27a, and the peripheral dummy electrode 29b may include the same material as the peripheral circuit gate electrode 27b. Planar shapes of the pixel dummy conductive pattern PDG and the peripheral dummy conductive pattern EDG may correspond to the planar shapes of the pixel blocking structure 83 and the peripheral blocking structure 87, respectively. Thus, the planar shapes of the pixel and peripheral dummy conductive patterns PDG and EDG may be variously modified depending on the planar shapes of the pixel and peripheral blocking structures 83 and 87.

The pixel dummy conductive pattern PDG and the peripheral dummy conductive pattern EDG may be formed together with the transfer gate TG and the peripheral circuit gate PG during the patterning process of the gates TG and PG described with reference to FIG. 7. Other elements and other fabricating processes of the image sensor of FIGS. 11 and 12 may be the same as or similar to corresponding elements and corresponding fabricating processes of the image sensor described with reference to FIGS. 3, 4 and 7 to 10.

Figure 13:
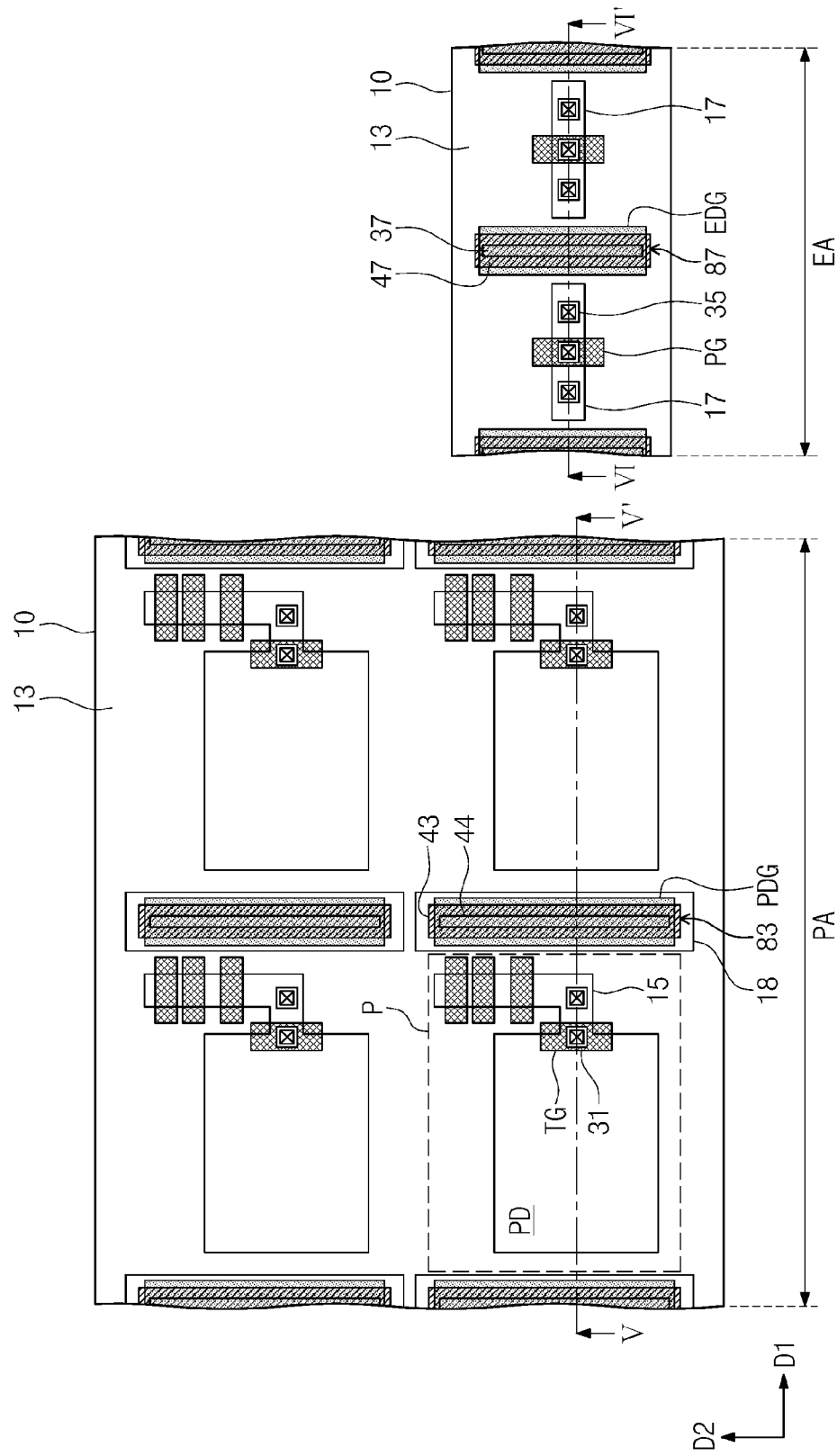
FIG. 13 is a plan view illustrating an image sensor according to at least one example embodiment the inventive concepts.
Figure 14:
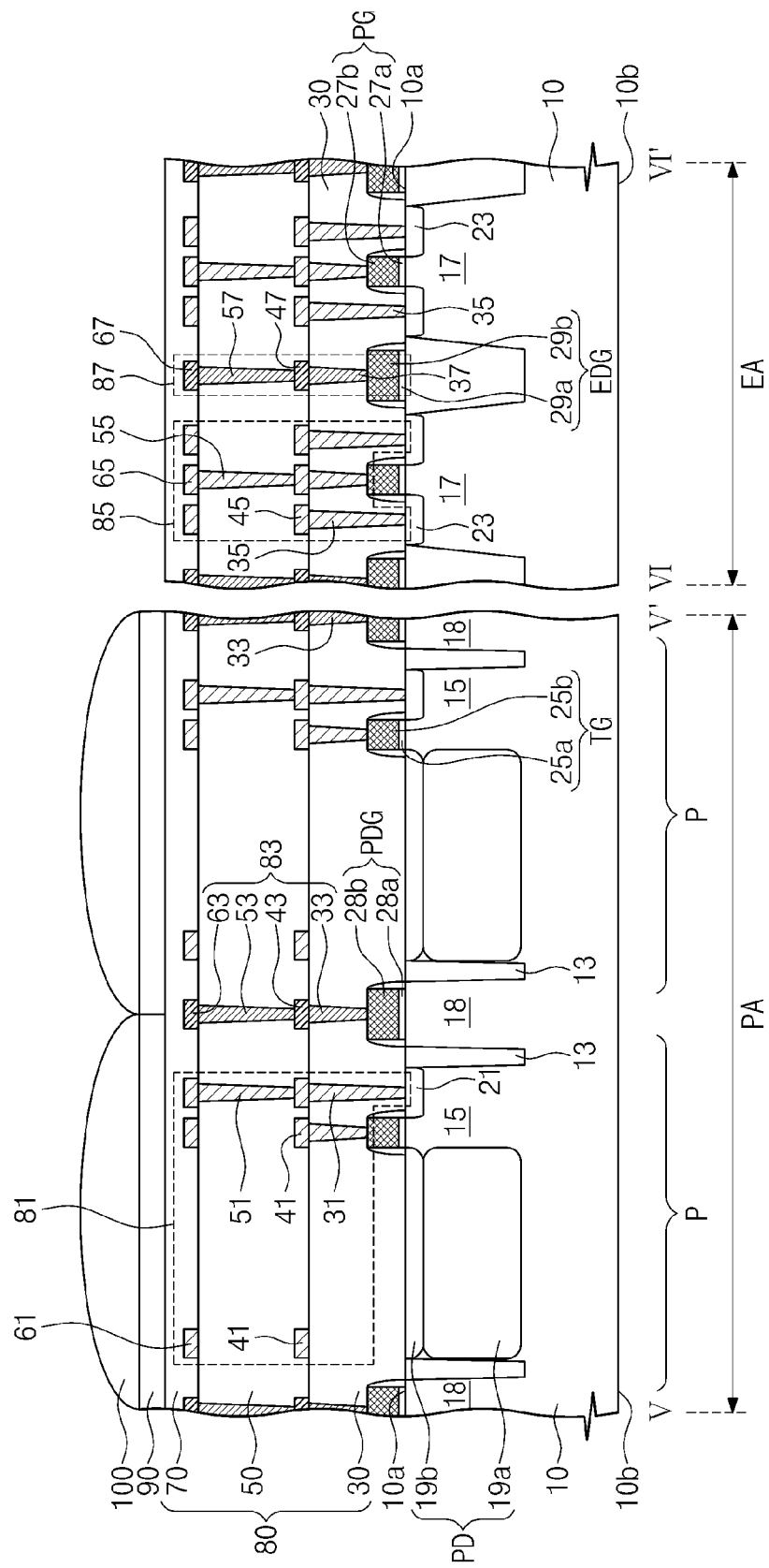
FIG. 14 is a cross-sectional view taken along lines V-V' and VI-VI' of FIG. 13.

FIG. 13 is a plan view illustrating an image sensor according to at least one example embodiment of the inventive concepts, and FIG. 14 is a cross-sectional view taken along lines V-V' and VI-VI' of FIG. 13. In an image sensor of FIGS. 13 and 14, third active regions 18 may be defined in the substrate 10 of the pixel region PA, and the pixel dummy conductive pattern PDG and the pixel blocking structure 83 may be disposed on each of the third active regions 18. Other elements of the image sensor in FIGS. 13 and 14 may be the substantially same as corresponding elements of the image sensor illustrated in FIGS. 11 and 12. In the description of FIGS. 13 and 14 below, the descriptions of the same elements in FIGS. 3, 4, 11, and 12 will be omitted for the purpose of ease and convenience in explanation.

Referring to FIGS. 13 and 14, a device isolation layer 13 may be disposed in the substrate 10. The device isolation layer 13 of the pixel region PA may define the first active regions 15 for the unit pixels P and the third active regions 18. Each of the third active regions 18 may be disposed between the first active regions 15 adjacent to each other in the first direction D1. The pixel dummy conductive pattern PDG may be disposed on each of the third active regions 18, and the pixel blocking structure 83 may be disposed on the pixel dummy conductive pattern PDG.

Each of the third active regions 18 may extend along the pixel dummy conductive pattern PDG and the pixel blocking structure 83 in the second direction D2 between the first active regions 15 which are adjacent to each other in the first direction D1. In other words, the third active region 18 may overlap with the pixel dummy conductive pattern PDG and the pixel blocking structure 83 when viewed from a plan view.

The image sensors illustrated in FIGS. 3, 4, 11, 12, 13 and 14 may be the front-side illuminated image sensors. In at least one example embodiment, image sensors according to the inventive concepts may include back-side illuminated image sensors. These will be described hereinafter.

Figure 15:
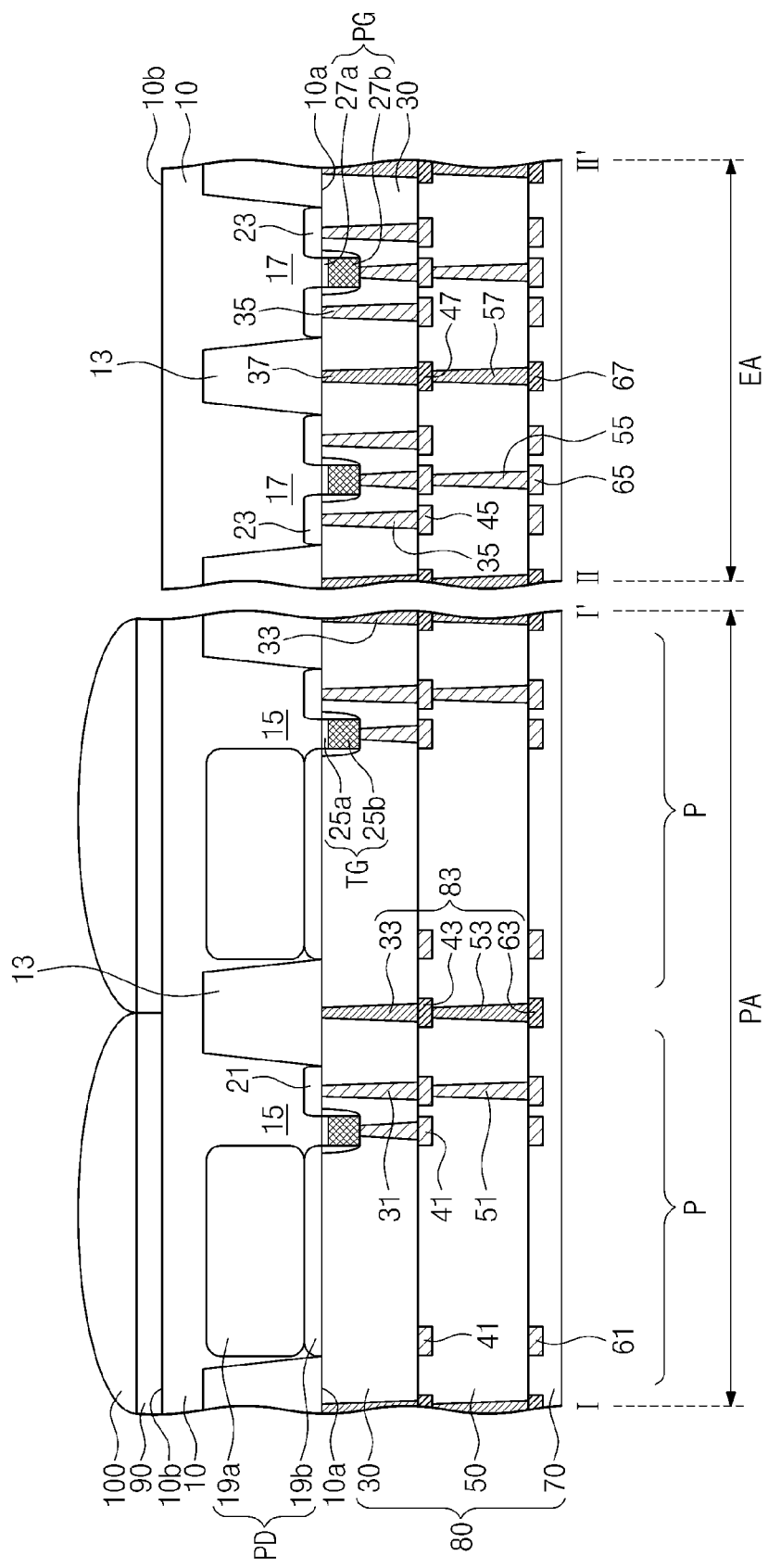
FIG. 15 is a cross-sectional view taken along lines I-I' and II-II' of FIG. 3 to illustrate an image sensor according to at least one example embodiment of the inventive concepts.

FIG. 15 is a cross-sectional view taken along lines I-I' and II-II' of FIG. 3 to illustrate an image sensor according to at least one example embodiment of the inventive concepts. In an image sensor of FIGS. 3 and 15, the color filter array 90 and the micro lens array 100 may be disposed on the second surface 10b of the substrate 10. Other elements of the image sensor of FIGS. 3 and 15 may be the substantially same as corresponding elements of the image sensor of FIGS. 3 and 4. In the description of FIG. 15 below, the descriptions of the same elements in FIGS. 3 and 4 will be omitted for the purpose of ease and convenience in explanation.

Referring to FIGS. 3 and 15, the color filter array 90 and the micro lens array 100 may be sequentially disposed on the second surface 10b of the substrate 10 of the pixel region PA. In this case, light may be inputted into the photoelectric conversion part PD through the micro lens array 100, the color filter array 90, and the second surface 10b. In other words, the image sensor of FIGS. 3 and 15 may be the back-side illuminated image sensor. In at least one example embodiment, the substrate 10 may be a laminated substrate.

The image sensor of FIGS. 3 and 15 may be fabricated by the following processes. The resultant structure of FIG. 10 may be turned over such that the second surface 10b of the substrate 10 faces upward. A back grinding process may be performed on the second surface 10b to remove a portion of the substrate 10. In other words, the substrate 10 may be laminated. Thereafter, the color filter array 90 and the micro lens array 100 may be sequentially formed on the second surface 10b of the laminated substrate 10.

Figure 16:
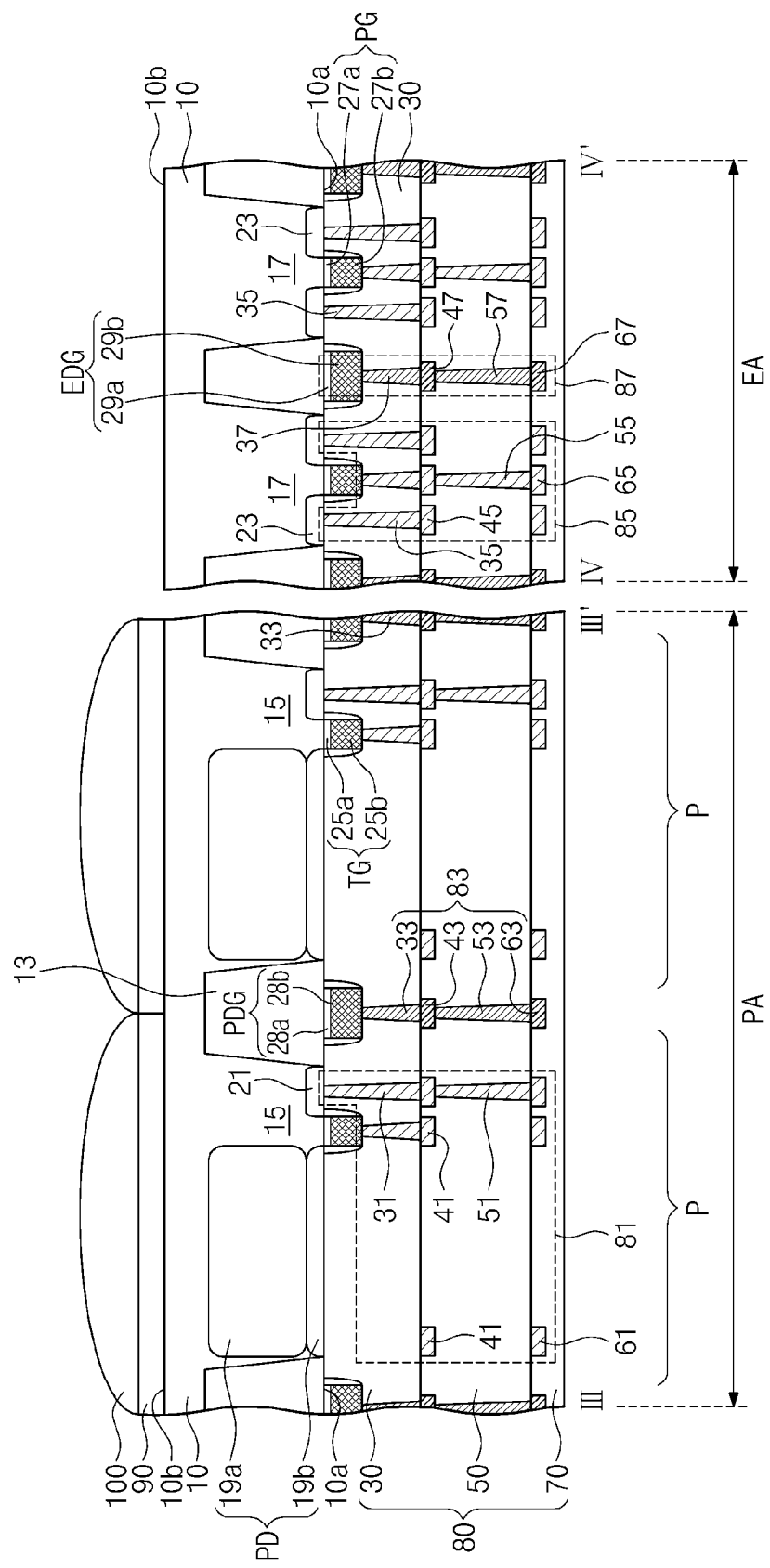
FIG. 16 is a cross-sectional view taken along lines III-III' and IV-IV' of FIG. 11 to illustrate an image sensor according to at least one example embodiment of the inventive concepts.

FIG. 16 is a cross-sectional view taken along lines III-III' and IV-IV' of FIG. 11 to illustrate an image sensor according to at least one example embodiment of the inventive concepts. In an image sensor of FIGS. 11 and 16, the color filter 90 and the micro lens array 100 may be disposed on the second surface 10b of the substrate 10. Other elements of the image sensor of FIGS. 11 and 16 may be the substantially same as corresponding elements of the image sensor of FIGS. 11 and 12. In the description of FIG. 16 below, the descriptions of the same elements in FIGS. 11 and 12 will be omitted for the purpose of ease and convenience in explanation.

Referring to FIGS. 11 and 16, the color filter array 90 and the micro lens array 100 may be sequentially disposed on the second surface 10b of the substrate 10 of the pixel region PA. In this case, light may be inputted into the photoelectric conversion part PD through the micro lens array 100, the color filter array 90, and the second surface 10b. In other words, the image sensor of FIGS. 11 and 16 may be the back-side illuminated image sensor. In at least one example embodiment, the substrate 10 may be a laminated substrate.

Figure 17:
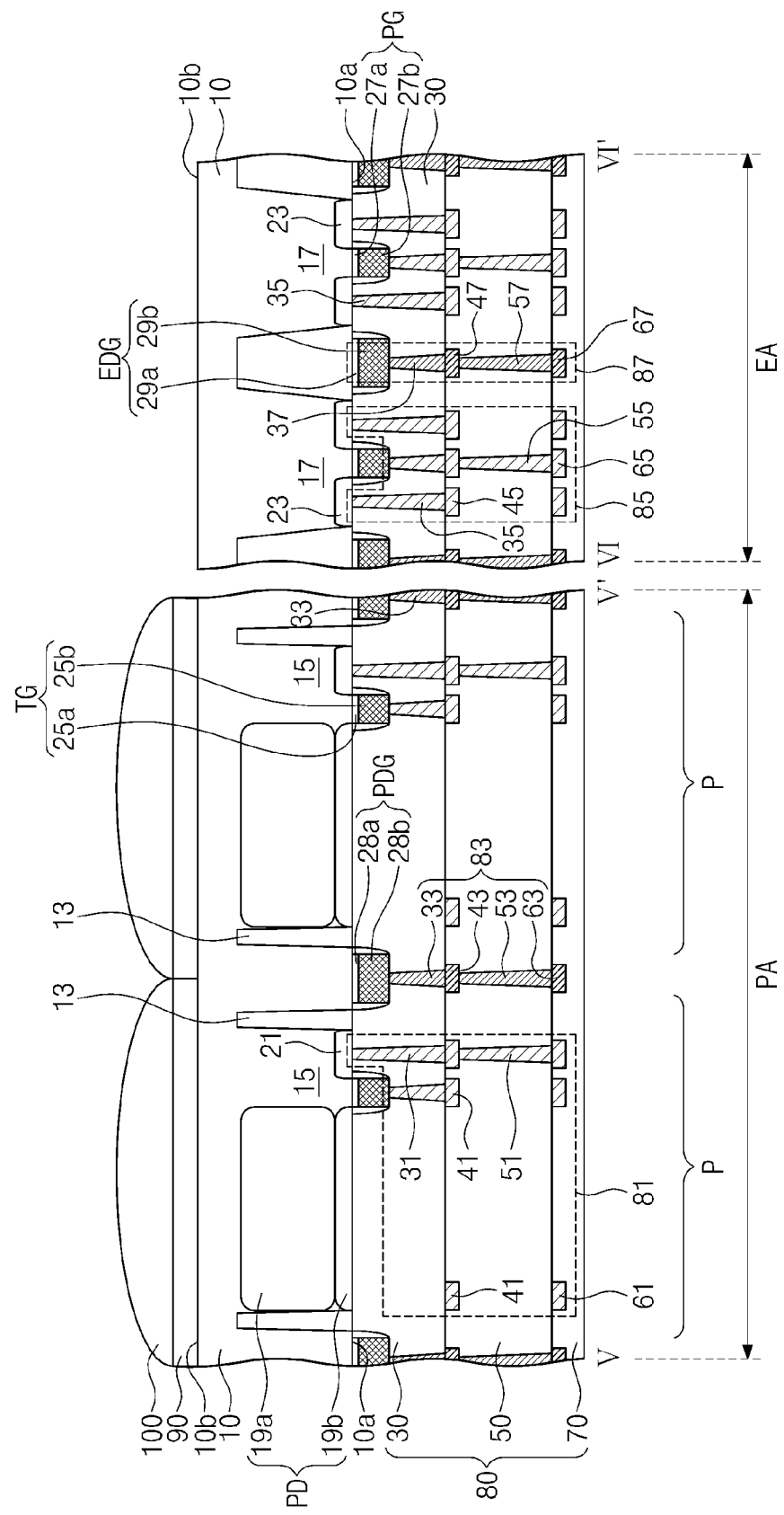
FIG. 17 is a cross-sectional view taken along lines V-V' and VI-VI' of FIG. 13 to illustrate an image sensor according to at least one example embodiment of the inventive concepts.

FIG. 17 is a cross-sectional view taken along lines V-V' and VI-VI' of FIG. 13 to illustrate an image sensor according to at least one example embodiment of the inventive concepts. In an image sensor of FIGS. 13 and 17, the color filter 90 and the micro lens array 100 may be disposed on the second surface 10b of the substrate 10. Other elements of the image sensor of FIGS. 13 and 17 may be the substantially same as corresponding elements of the image sensor of FIGS. 13 and 14. In the description of FIG. 17 below, the descriptions of the same elements in FIGS. 13 and 14 will be omitted for the purpose of ease and convenience in explanation.

Referring to FIGS. 13 and 17, the color filter array 90 and the micro lens array 100 may be sequentially disposed on the second surface 10b of the substrate 10 of the pixel region PA. In this case, light may be inputted into the photoelectric conversion part PD through the micro lens array 100, the color filter array 90, and the second surface 10b. In other words, the image sensor of FIGS. 13 and 17 may be the back-side illuminated image sensor. In at least one example embodiment, the substrate 10 may be a laminated substrate.

Figure 18:
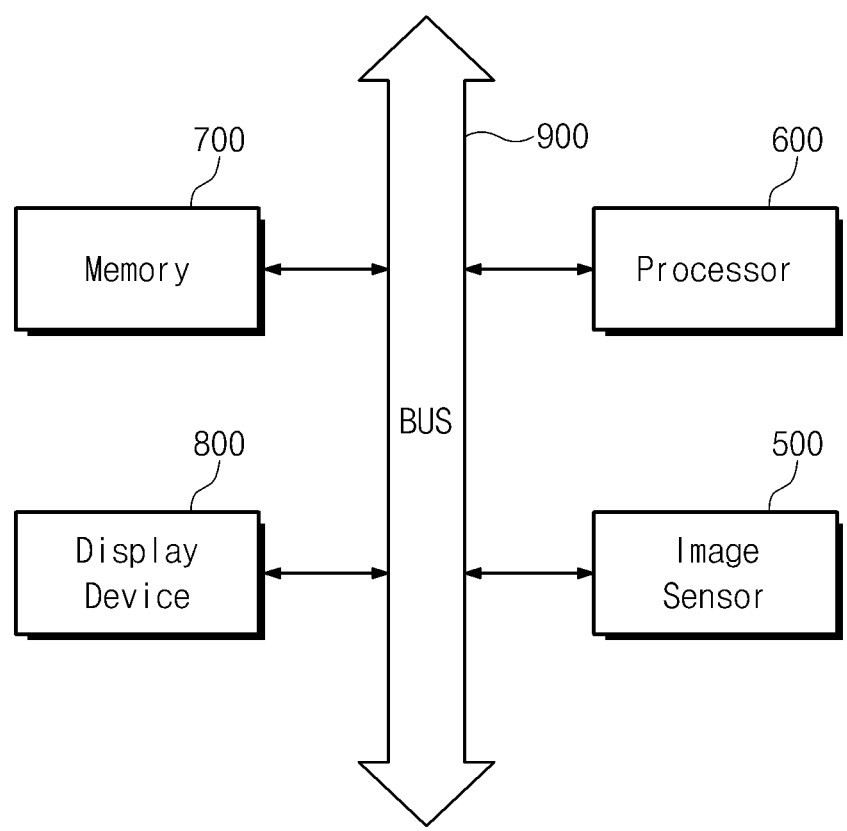
FIG. 18 is a schematic block diagram illustrating an electronic device including an image sensor according to at least one example embodiment of the inventive concepts.

FIG. 18 is a schematic block diagram illustrating an electronic device including an image sensor according to at least one example embodiment of the inventive concepts.

An electronic device may be a digital camera or a mobile device. Referring to FIG. 18, a digital camera system may include an image sensor 500, a processor 600, a memory device 700, a display device 800, and a system bus 900. The image sensor 500 may capture external image information in response to control signals of the processor 600. The processor 600 may store the captured image information in the memory device 700 through the system bus 900. The process 600 may display the image information stored in the memory device 700 on the display device 800.

Figure 19:
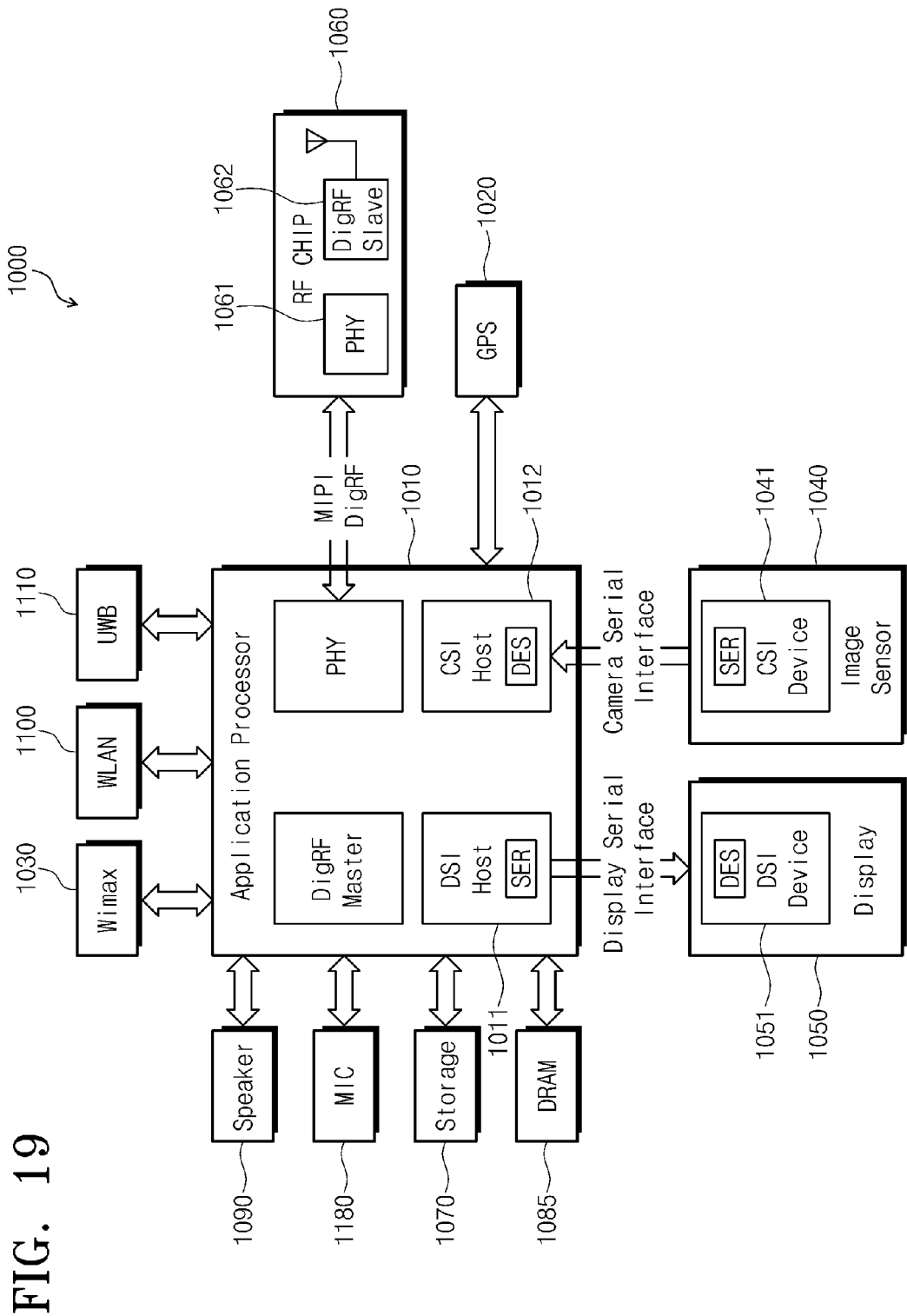
FIG. 19 is a schematic block diagram illustrating an electronic system including an image sensor according to at least one example embodiment of the inventive concepts.
Figure 20:
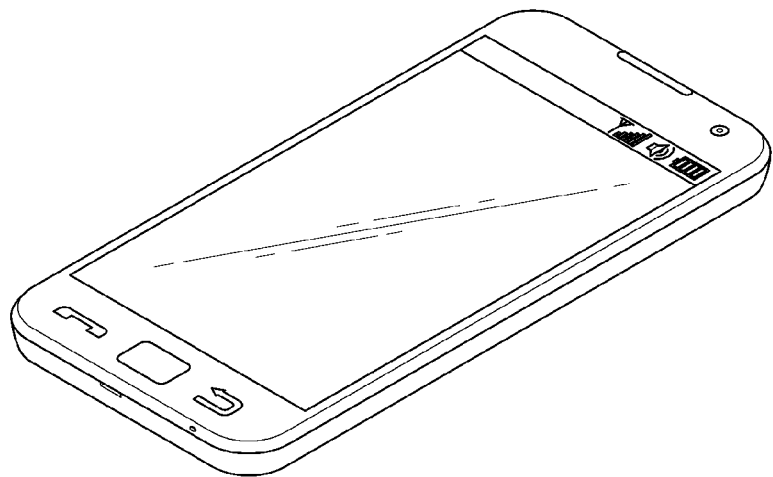
FIGS. 20 to 24 illustrate examples of multimedia devices implemented with image sensors according to at least one example embodiment of the inventive concepts.
Figure 21:
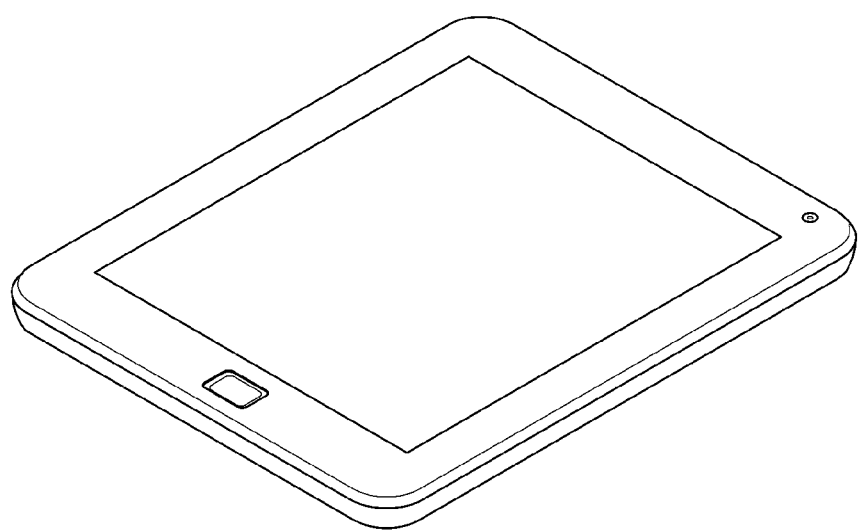
Figure 22:
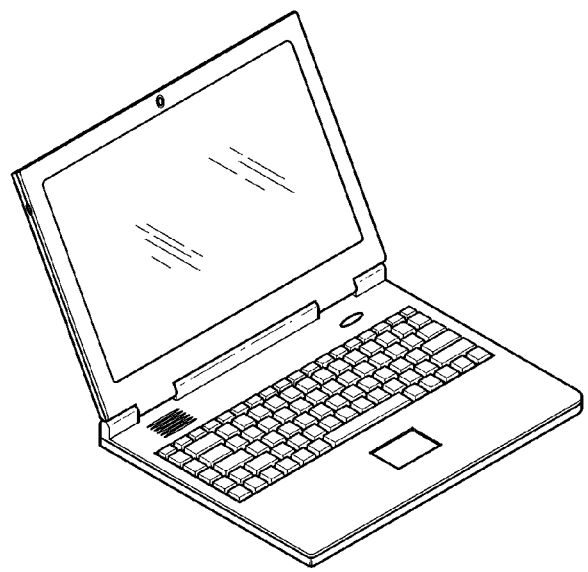
Figure 23:
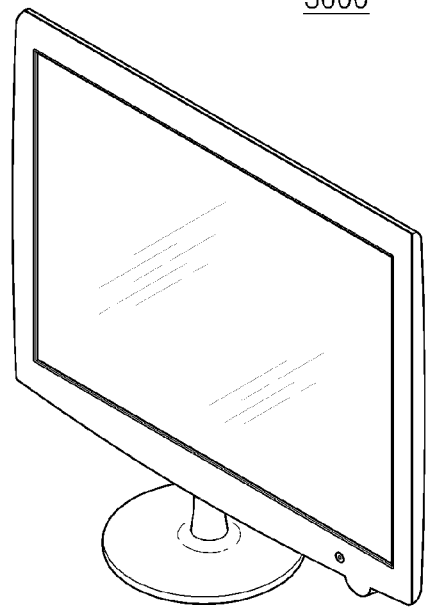
Figure 24:
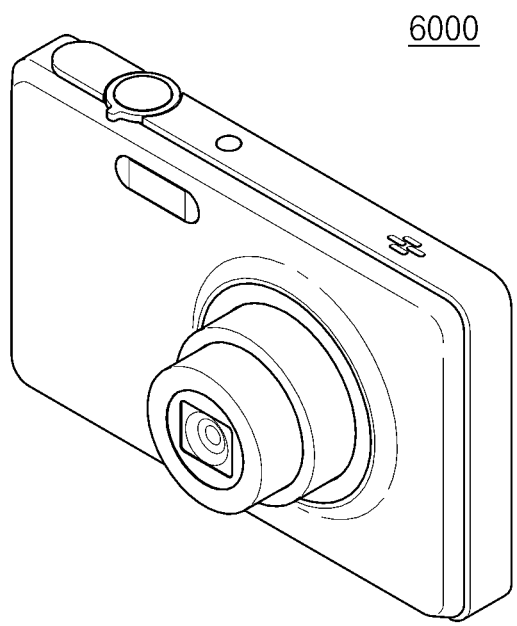

FIG. 19 is a schematic block diagram illustrating an electronic system including an image sensor according to at least one example embodiment of the inventive concepts.

Referring to FIG. 19, an electronic system 1000 may be realized as a data processing device capable of using or supporting the mobile industry processor interface (MIPI), e.g., a portable phone, a personal digital assistant (PDA), a portable multimedia player (PMP), or a smart phone.

The electronic system 1000 may include an application processor 1010, an image sensor 1040, and a display device 1050. The image sensor 1040 may be one of the image sensors according to at least one example embodiment of the inventive concepts.

A camera serial interface (CSI) host 1012 realized in the application processor 1010 may serially communicate with a CSI device 1041 of the image sensor 1040 through a camera serial interface (CSI). For example, an optical de-serializer may be realized in the CSI host 1012, and an optical serializer may be realized in the CSI device 1041.

A display serial interface (DSI) host 1011 realized in the application processor 1010 may serially communicate with a DSI device 1051 of the display device 1050 through a display serial interface (DSI). For example, an optical serializer may be realized in the DSI host 1011, and an optical de-serializer may be realized in the DSI device 1051.

The electronic system 1000 may further include a radio frequency (RF) chip 1060 capable of communicating with the application processor 1010. A PHY 1013 of the electronic system 1000 may exchange data with a PHY 1061 of the RF chip 1060 according to MIPI DigRF.

The electronic system 1000 may further include a global positioning system (GPS) 1020, a storage 1070, a microphone 1080, a dynamic random access memory (DRAM) 1085, and a speaker 1090. The electronic system 1000 may communicate using Wimax 1030, WLAN 1100, and UWB 1110.

FIGS. 20 to 24 illustrate examples of multimedia devices implemented with image sensors according to at least one example embodiment of the inventive concepts.

The image sensor according to at least one example embodiment of the inventive concepts may be applied to various multimedia devices. For example, the image sensor of at least one example embodiment of the inventive concepts may be applied to a mobile or smart phone 2000 illustrated in FIG. 20 and/or a tablet or smart tablet 3000 illustrated in FIG. 21. In addition, the image sensor according to at least one example embodiment may be applied to a notebook computer 4000 illustrated in FIG. 22 and/or a television or smart television 5000 illustrated in FIG. 23. Furthermore, the image sensor according to at least one example embodiment may be applied to a digital camera or camcorder 6000 illustrated in FIG. 24.

According at least one example embodiment of the inventive concepts, the pixel blocking structure may be disposed between the unit pixels adjacent to each other in the row direction. The pixel blocking structure may be formed of the conductive material, and the constant voltage may be applied to the pixel blocking structure during the operation of the image sensor. In other words, the constant voltage may be applied to the pixel blocking structure while the electrical signal corresponding to the incident light is outputted to the column line through the pixel interconnection structure. Thus, the coupling effect between the unit pixels adjacent to each other in the row direction may be mitigated to reduce (or alternatively, minimize or, alternatively prevent) the crosstalk between the adjacent unit pixels.

In addition, according to at least one example embodiment of the inventive concepts, the peripheral blocking structure formed of the conductive material may be disposed between the peripheral interconnection structures adjacent to each other in the peripheral circuit region. The constant voltage may be applied to the peripheral blocking structure during the correlated double sampling operation. Thus, the coupling effect between the adjacent peripheral interconnection structures may be mitigated to reduce (or alternatively, minimize or alternatively, prevent) the distortion phenomenon of the electrical signal outputted from the column line. As a result, it is possible to reduce or minimize the crosstalk of the image sensor.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
   a substrate including a pixel region and a peripheral circuit region;
   a first device isolation layer disposed in the substrate to define a plurality of unit pixels that are adjacent to each other in a first direction in the pixel region, each of the plurality of unit pixels including at least one light sensing element disposed in the substrate;
   an interlayer insulating structure on the substrate; and
   a first blocking structure disposed on the first device isolation layer and penetrating the interlayer insulating structure,
   wherein the first blocking structure is disposed between the plurality of unit pixels when viewed from a plan view, and
   wherein the first blocking structure extends in a second direction intersecting the first direction when viewed from a plan view.

2. The image sensor of claim 1, wherein the first blocking structure includes a conductive material.

3. The image sensor of claim 2, wherein each of the plurality of unit pixels comprises a pixel circuit,
   wherein the pixel circuit comprises at least one gate electrode disposed adjacently to the at least one light sensing element on the substrate,
   wherein the peripheral circuit region comprises a peripheral logic circuit,
   wherein the pixel circuit is configured to output an electrical signal generated by the at least one light sensing element to the peripheral logic circuit, and
   wherein the first blocking structure is configured to receive a constant voltage during the output of the electrical signal.

4. The image sensor of claim 1, wherein the interlayer insulating structure comprises a first interlayer insulating layer, and
   wherein the first blocking structure comprises,
   a first pixel blocking plug penetrating the first interlayer insulating layer and being in contact with the first device isolation layer, and
   a first pixel blocking interconnection disposed on the first interlayer insulating layer and being in contact with the first pixel blocking plug.

5. The image sensor of claim 4, wherein the interlayer insulating structure further comprises a second interlayer insulating layer disposed on the first interlayer insulating layer, and
   wherein the first blocking structure further comprises,
   a second pixel blocking plug penetrating the second interlayer insulating layer and being in contact with the first pixel blocking interconnection, and
   a second pixel blocking interconnection disposed on the second interlayer insulating layer and being in contact with the second pixel blocking plug.

6. The image sensor of claim 1, wherein the interlayer insulating structure comprises a first interlayer insulating layer and a second interlayer insulating layer sequentially stacked, and
   wherein the first blocking structure comprises,
   a first pixel blocking interconnection disposed between the first interlayer insulating layer and the second interlayer insulating layer,
   a second pixel blocking interconnection disposed on the second interlayer insulating layer, and
   a pixel blocking plug disposed in the second interlayer insulating layer and connecting the first pixel blocking interconnection to the second pixel blocking interconnection.

7. The image sensor of claim 1, further comprising:
   a first dummy conductive pattern disposed between the first device isolation layer and the first blocking structure,
   wherein the first dummy conductive pattern extends along the first blocking structure in the second direction when viewed from a plan view.

8. The image sensor of claim 1, further comprising:
   a second device isolation layer disposed in the substrate to define active regions adjacent to each other in a third direction in the peripheral circuit region; and
   a second blocking structure disposed on the second device isolation layer and penetrating the interlayer insulating structure,
   wherein the second blocking structure extends in a fourth direction intersecting the third direction between the adjacent active regions when viewed from a plan view.

9. The image sensor of claim 8, wherein the second blocking structure includes a conductive material.

10. The image sensor of claim 8, further comprising:
    a second dummy conductive pattern disposed between the second device isolation layer and the second blocking structure,
    wherein the second dummy conductive pattern extends along the second blocking structure in the fourth direction when viewed from a plan view.

11. An image sensor comprising:
    a substrate including a pixel region and a peripheral circuit region;
    a first device isolation layer disposed in the substrate to define a plurality of unit pixels that are adjacent to each other in a first direction in the pixel region; and
    a first blocking structure disposed on the first device isolation layer between the plurality of unit pixels, the first blocking structure extending in a second direction intersecting the first direction,
    wherein the first blocking structure includes a conductive material,
    wherein the peripheral circuit region comprises a peripheral logic circuit, and
    wherein each of the plurality of unit pixels comprises,
    at least one light sensing element configured to convert an optical signal corresponding to incident light into an electrical signal, and
    a pixel circuit configured to output the electrical signal to the peripheral logic circuit.

12. The image sensor of claim 11, wherein the first blocking structure is configured to receive a constant voltage during the output of the electrical signal.

13. The image sensor of claim 11, further comprising:
    a second device isolation layer disposed in the substrate to define active regions adjacent to each other in a third direction in the peripheral circuit region; and
    a second blocking structure disposed on the second device isolation layer between the adjacent active regions, the second blocking structure extending in a fourth direction intersecting the third direction,
    wherein the second blocking structure includes a conductive material, and
    wherein the peripheral logic circuit comprises: a peripheral circuit gate disposed on each of the active regions.

14. The image sensor of claim 13, wherein the peripheral logic circuit is configured to receive the electrical signal outputted from the pixel circuit, and wherein the second blocking structure is configured to receive a constant voltage while the peripheral logic circuit receives the electrical signal.

15. The image sensor of claim 11, wherein the at least one light sensing element is disposed in the substrate of each of the plurality of unit pixels, and wherein the pixel circuit comprises at least one gate electrode disposed adjacently to the at least one light sensing element on the substrate.

16. An image sensor, comprising:
a substrate including a plurality of unit pixels connected to a plurality of peripheral circuits, the plurality of unit pixels being spaced apart from each other in a first direction, the plurality of peripheral circuits being spaced apart from each other in a second direction;
at least one interlayer insulating layer on the substrate;
a first blocking structure disposed between the plurality of unit pixels and penetrating the at least one interlayer insulating layer; and
a second blocking structure disposed between the plurality of peripheral circuits and penetrating the at least one interlayer insulating layer,
wherein the first blocking structure extends in a third direction that intersects the first direction and the second blocking structure extends in a fourth direction that intersects the second direction.

17. The image sensor of claim 16, wherein the at least one interlayer insulating layer includes a first interlayer insulating layer and a second interlayer insulating layer, the first blocking structure is conductive and includes a first plurality of plugs connected to a first plurality of interconnections, and the second blocking structure is conductive and includes a second plurality of plugs connected to a second plurality of interconnections.

18. The image sensor of claim 16, wherein each of the plurality of unit pixels includes,
at least one light sensing element configured to convert sensed light into an electrical signal, and
a pixel circuit configured to output the electrical signal to an associated one of the plurality of peripheral circuits.

19. The image sensor of claim 18, wherein each of the plurality of peripheral circuits includes a sampling circuit configured to sample the electrical signal.

20. The image sensor of claim 19, further comprising:
a voltage supply configured to apply a first constant voltage to the first blocking structure during operation of the pixel circuit and apply a second constant voltage to the second blocking structure during operation of the peripheral circuit.

* * * * *